United States Patent
Barman Roy et al.

(10) Patent No.: US 10,541,525 B1
(45) Date of Patent: Jan. 21, 2020

(54) CONFIGURABLE RETRY FOR SYSTEM OPERATIONS

(71) Applicant: TEXAS INSTRUMENTS INCORPORATED, Dallas, TX (US)

(72) Inventors: Abhrarup Barman Roy, West Bengal (IN); Abhishek Kumar, Bangalore (IN); Subrato Roy, Bangalore (IN); Ankur Chauhan, Bangalore (IN); Abhinay Patil, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/287,458

(22) Filed: Feb. 27, 2019

(30) Foreign Application Priority Data

Jul. 17, 2018 (IN) .............................. 201841026623

(51) Int. Cl.
| | |
|---|---|
| *G06F 13/20* | (2006.01) |
| *G06F 13/24* | (2006.01) |
| *H02H 3/06* | (2006.01) |
| *H03K 5/135* | (2006.01) |
| *H03K 21/10* | (2006.01) |
| *H03K 21/38* | (2006.01) |
| *H03K 19/20* | (2006.01) |

(52) U.S. Cl.
CPC ............. *H02H 3/066* (2013.01); *H03K 5/135* (2013.01); *H03K 21/10* (2013.01); *H03K 21/38* (2013.01); *H03K 19/20* (2013.01)

(58) Field of Classification Search
CPC ........ H03K 21/38; H03K 5/135; H03K 21/10; H03K 19/20; H02H 3/066
See application file for complete search history.

(56) References Cited

U.S. PATENT DOCUMENTS

| | | | | |
|---|---|---|---|---|
| 7,831,882 B2* | 11/2010 | Tsern | .................. | G06F 11/1008 714/751 |
| 2015/0074312 A1* | 3/2015 | Barus | .................. | G06F 13/4027 710/306 |

* cited by examiner

*Primary Examiner* — Kenneth B Wells
(74) *Attorney, Agent, or Firm* — Tuenlap Chan; Charles A. Brill; Frank D. Cimino

(57) ABSTRACT

The present disclosure relates to configuring parameters of a system. In some examples, a timer duration circuit can be configured to output a timer duration signal defining a time duration for a retry signal based on an impedance of a first circuit coupled at a first node. A logic circuit can be configured to control an output of the retry signal to at least one integrator circuit to control a current to a second node based on one of the timer duration signal and a retry timer signal, and a combination thereof. An output circuit can be configured to output a stop retry signal based on a voltage established by a second circuit at the second node based on its impedance and the current. The stop retry signal can indicate a number of retries that have occurred and can be based on the capacitances of the first and second circuits.

20 Claims, 8 Drawing Sheets

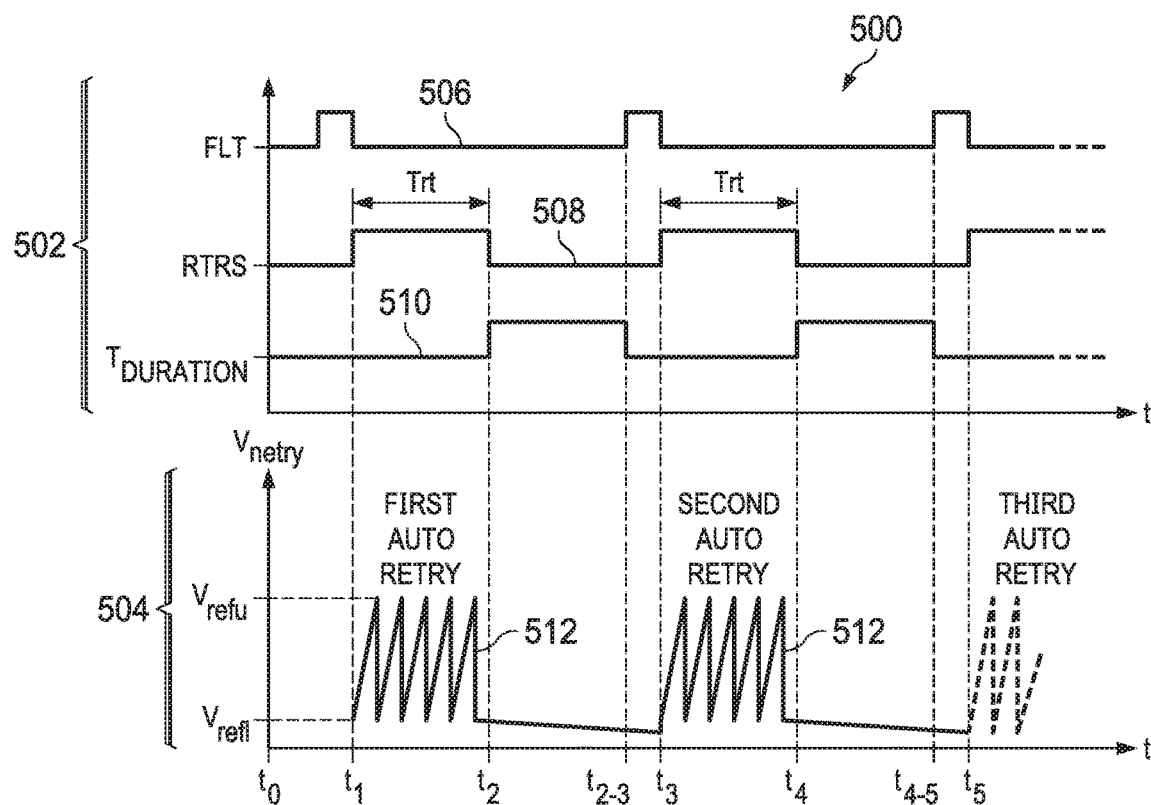
FIG. 5
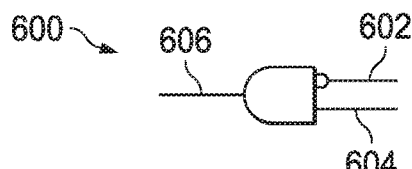
FIG. 6
| TOTAL ERROR IN $N_A$ (%) | | 33 |
|---|---|---|
| $N_{min\_A}$ | $N_p$ | $N_{max\_A}$ |
| 3 | 4 | 6 |
| 11 | 16 | 22 |
| 43 | 64 | 86 |
| 172 | 256 | 341 |
| 687 | 1024 | 1362 |
FIG. 7

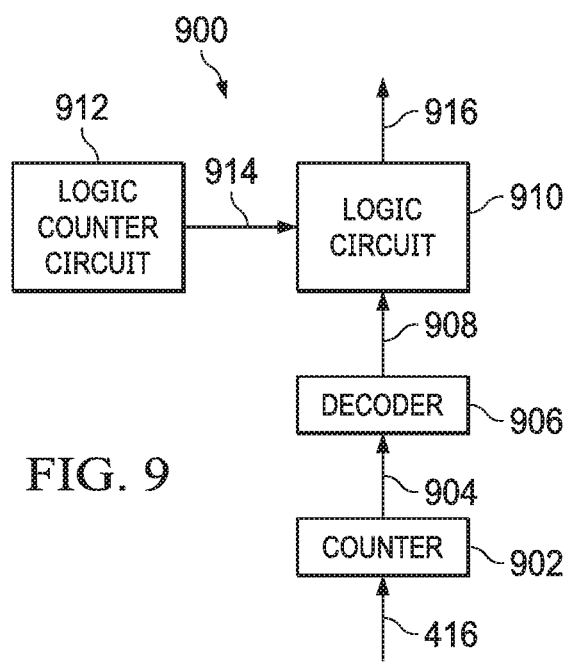
FIG. 9
FIG. 10
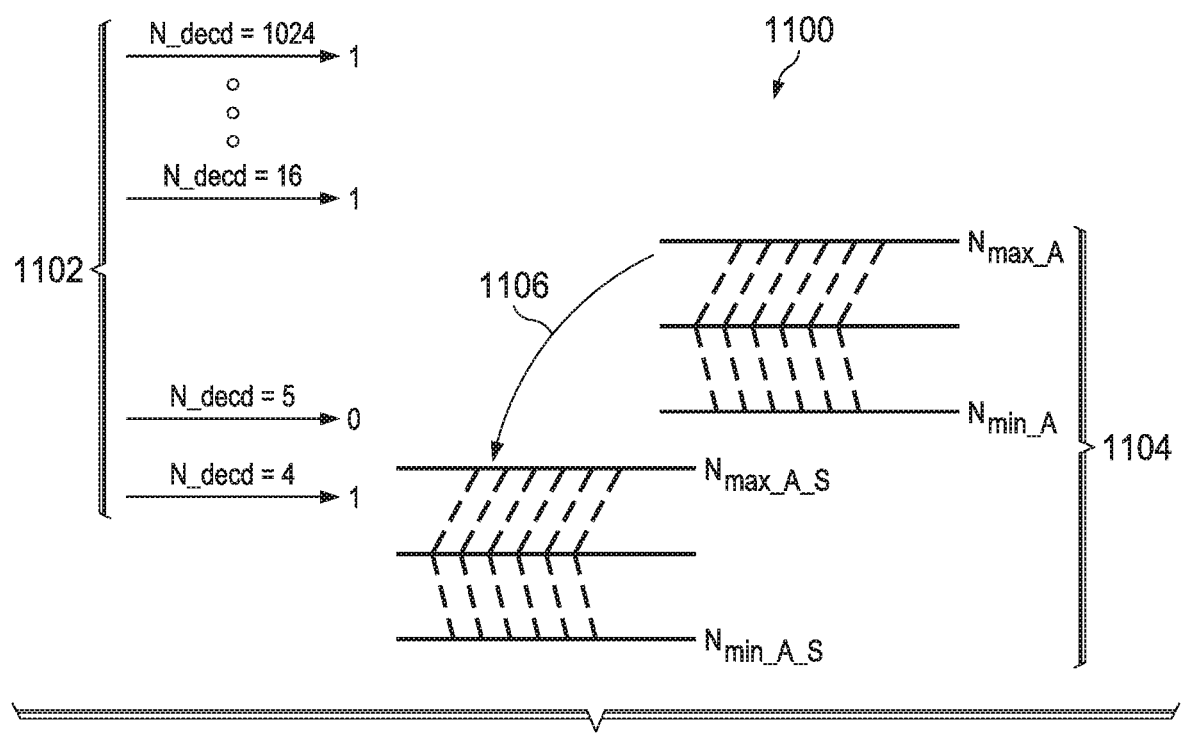
FIG. 11

__US 10,541,525 B1__

CONFIGURABLE RETRY FOR SYSTEM OPERATIONS

CROSS-REFERENCE TO RELATED APPLICATION

This application claims the benefit of priority from India provisional patent application no. 201841026623, filed Jul. 17, 2018, and entitled A NOVEL AUTO RETRY SCHEME AND METHOD OF IMPLEMENTATION, which is incorporated herein by reference in its entirety.

TECHNICAL FIELD

The present disclosure relates to configurable retry for system operations.

BACKGROUND

Circuit protection devices are utilized to protect electrical circuits from currents and voltages that are outside their normal operating ranges. Circuit protection devices are used to manage inrush, overload, short circuit, and overvoltage events, and to guard sensitive loads for reliable system operation.

SUMMARY

In an example, a system includes a timer duration circuit coupled to a first node and configured to output a timer duration signal. A first circuit is coupled to the first node. The timer duration signal defines a time duration for a retry signal based on an impedance of the first circuit. The system further includes a logic circuit configured to control the retry signal that is output to at least one integrator circuit to control a current to a second node based on one of the timer duration signal, a retry timer signal (RTRS), and a combination thereof. A second circuit is coupled to the second node and provides a voltage at the second node based on an impedance of the second circuit and the current. The system further includes an output circuit configured to output a stop retry signal based on the voltage at the second node. The stop retry signal indicates a number of retries that have occurred. The number of retries is set based on the impedances of the first and second circuits.

In another example, a system includes a first circuit configured to receive output signals from flip-flop circuits of a counter established based on a voltage at a node in response to a retry timer signal (RTRS) over time intervals. The first circuit is configured to provide a counter count signal based on the output signals. The counter count signal is to indicate a shifted number of retries of an actual number of retries stored at the counter that have occurred over the time intervals. The system further includes a second circuit configured to output a stop retry signal based on the counter count signal and a decoded retry signal outputted following a given number of pulses of the RTRS over the time intervals. The stop retry signal indicates that a given number of retries have occurred.

In yet another example, a circuit includes a first circuit having a first input coupled to an output of a first flip-flop circuit and a second input coupled to an output of a second flip-flop circuit. The circuit further includes a logic circuit having a first input and a second input. The first input is coupled an output of the first circuit. The circuit further includes a decoder having an output coupled to the second input of the logic circuit, and a counter having an input coupled to an auto retry system and an output coupled to an input of the decoder.

BRIEF DESCRIPTION OF THE DRAWINGS

FIG. 5 illustrates another example of a timing and voltage diagram.

FIG. 6 illustrates an example logic gate circuit.

FIG. 7 illustrates an example of a table of component induced errors and their effects on a number of retries.

FIG. 9 illustrates an example of an error masking retry circuit.

FIG. 10 illustrates an example of a decoding table.

FIG. 11 illustrates shifting of a number of retries stored by a counter.

DETAILED DESCRIPTION

Figure 1:
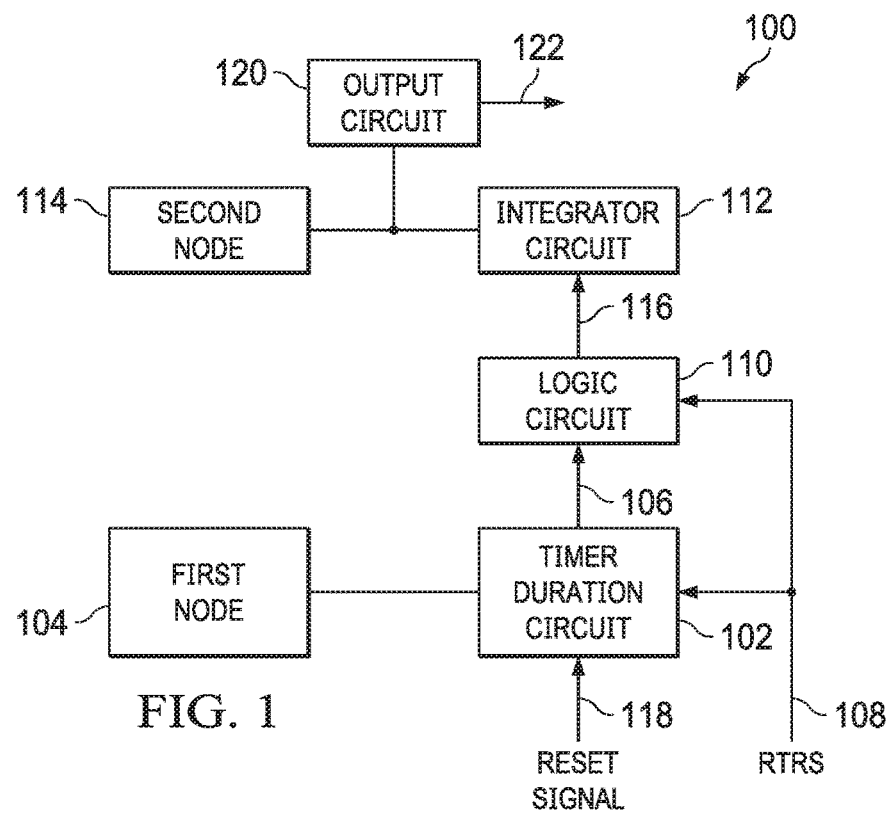
FIG. 1 illustrates an example of a configurable auto retry system.

The present disclosure relates to configuring parameters to control retry of system operations. Much of the examples described herein relate to configuring retry parameters of a circuit protection device, such as a given number of retries ($N_P$) (e.g., power cycles) and a retry delay ($T_{RT}$) (e.g., an amount of time between retries). However, the examples described herein should not be construed or limited to only configuring parameters of circuit protection devices. The systems and methods of the present disclosure can be used to configure parameters (e.g., events, state transitions, such as on-state, off-state, etc.) of other systems (e.g., fault diagnostic systems, overall power management systems, etc.). For example, the systems and methods described herein can be used to set parameters of an aperture control circuit of a camera.

In some examples, circuit protection devices (e.g., an eFuse, a Hot Swap controller, etc.) can be used in a circuit path (e.g., power supply path) to turn off current to a component during a fault. In response to detecting a fault (e.g., overload, short circuit, thermal stress, etc.), circuit protection devices may turn off due to excessive temperature. In thermal shutdown, these devices can be configured to remain off until the fault clears (e.g., until manually or automatically restarted). Circuit protection devices with an automatic retry ("auto retry") circuit can periodically power cycle the circuit protection device for a fixed or an infinite number of retries until the fault has been cleared, or a given number of retries have been reached. If the fault has been cleared following a power cycle, normal device operation can be resumed.

Existing auto retry circuits cannot count a number of retries of a circuit protection device, which depending on application requirements, may result in damage to the circuit protection device, or even circuitry that is being protected. Furthermore, existing auto retry circuit do not permit the auto retry parameters of the auto retry circuit to be configured (e.g., changed) after the auto retry circuit has been produced. The configurable auto retry system described herein can be configured to properly count the number of retries and can have configurable auto retry parameters. For example, the configurable auto retry system can include a timer duration circuit configured to output a timer duration signal that can define a time duration for the retry signal. The time duration can be representative of a retry delay and can be set based on an impedance of an external circuit that is coupled to an input node.

A logic circuit can be configured to control the retry signal to control a current that can be supplied to a second node based on the timer duration signal, a retry timer signal (RTRS) or a combination thereof. A second circuit can be coupled to the second node to provide a voltage at the second node that can be based on an impedance of the second circuit and the current. An output circuit can be configured to output a stop retry signal based on the voltage at the second node. The stop retry signal can be indicative of a number of retries that have occurred, which can be set based on the impedances of the first and second circuits. In this way, the retry delay and the number of retries can be set for a circuit protection device based on one or more external circuits coupled to respective nodes (e.g., pins) of the configurable auto retry system. In some examples, the one or more circuits can include one or more capacitors. Accordingly, the configurable auto retry circuit disclosed herein can be configurable to enable an associated circuit protection device to meet particular specifications (e.g., design parameters) and/or application.

In some examples, a circuit protection device can be power cycled (e.g., reset) a given number of retries ($N_P$) and according to a retry delay ($T_{RT}$), as defined by the configurable auto retry system. For example, the number of retries $N_P$ can be a value that can be configurable based on an impedance (e.g., capacitance) of one or more external circuits coupled to the circuit protection device. The retry delay $T_{RT}$ can define an amount of time between retries (e.g., power cycles) for the circuit protection device. The configurable auto retry system can be configured to monitor the number of power cycle retries and determine if the number of retries $N_P$ has been reached. Following each power cycle, the circuit protection device (e.g., a controller) can be configured to monitor for an indication (e.g., a signal) that the given number of retries $N_P$ has been reached. The circuit protection device can continue to cycle until the indication. In response to receiving the indication, the circuit protection device can be configured to shut off.

In some examples, current sources of the configurable auto retry system can exhibit fabrication variability (e.g., variation in their physical characteristics from their designed values) and resultantly can suffer from mismatching (e.g., current mirror mismatching). Such variations can cause electrical parameters of the current sources to deviate from their intended behavior and induce errors in the number of retries being provided by the configurable auto retry system, which for some applications, may be undesirable. Additionally, in some examples, capacitor tolerance variations (e.g., an extent to which an actual capacitance can vary from a nominal value) and current leakage in the external circuits coupled to the configurable auto retry system can also induce errors in the number of retries being provided by the configurable auto retry system. The actual number of retries that have occurred for the circuit protection device being stored by a counter of the configurable auto retry system can be affected by the current sources and capacitor errors (referred to herein collectively as "component induced errors"). An error masking retry circuit is described herein and can be configured to compensate for the component induced errors by masking such errors such that a stop retry signal can be outputted by the configurable auto retry system according to the given number of retries set for the circuit protection device.

The error masking retry circuit can include a first circuit that can be configured to receive output signals from flip-flop circuits of a counter of the configurable auto retry system established based on a voltage at a node of the configurable auto retry system in response to a retry timer signal (RTRS) over time intervals. The first circuit can be configured to provide a counter count signal based on the output signals. The counter count signal can indicate a shifted number of retries of an actual number of retries stored at the counter that have occurred over the time intervals. The error masking retry circuit can include a second circuit that can be configured to output a stop retry signal based on the counter count signal and a decoded retry signal outputted following a given number of pulses of the RTRS over the time intervals. The stop retry signal can indicate that the given number of retries have occurred for the circuit protection device. Accordingly, the error masking retry circuit can mask errors to compensate for component induced errors in the configurable auto retry system.

As a further example, the systems described herein can be integrated into an integrated circuit (IC) protection circuit, or a circuit protection device, or in some examples, can be provided as a standalone circuit (e.g., standalone element) that can be mounted on a surface of a printed circuit board (PCB). In other examples, the systems described herein can be provided as plug-in elements that can be coupled to sockets (receiving terminals) of the PCB having elements to implement the circuit protection functions.

FIG. 1 illustrates an example of a configurable auto retry system 100. The system 100 can include a timer duration circuit 102 that can be coupled to the first node 104. The timer duration circuit 102 can be configured to establish an amount of time (e.g., a retry delay) between retries (e.g., power cycles) for the circuit protection device based on an impedance of a first external circuit (not shown in FIG. 1). For example, the timer duration circuit 102 can be configured to output a timer duration signal 106 based on a voltage at a first node 104 in response to a retry timer signal (RTRS) 108. The first external circuit can be coupled to the first node 104 of the system 100. In some examples, the first circuit can include one or more capacitors. The first circuit can be configured to store a charge based on a current at the first node 104. For example, the timer duration circuit 102 can include one or more current sources (not shown in FIG. 1) to provide the current at the first node 104. The one or more current sources can correspond to a current source in a current range from about (2) micro-amps (μA) to about 20 μA.

In some examples, the RTRS 108 can be provided in response to an assertion of a fault (FLT) signal (not shown in FIG. 1). The FLT signal can be asserted (e.g. outputted) by a fault sensor (not shown in FIG. 1). In some examples, the circuit protection device can include the fault sensor. The fault sensor can be configured to monitor for a fault and assert the FLT signal in response to detecting the fault. The RTRS 108 can be outputted, for example, by a retry timer oscillator (not shown in FIG. 1) of the circuit protection device in response to detecting the FLT signal. In some examples, the RTRS 108 can be generated in response to detecting a falling edge of a pulse of the FLT signal.

As a further example, the one or more current sources can be configured to supply the current to charge the first circuit to generate a voltage at the first node 104. The charge stored at the first circuit can be based on an impedance of the first circuit. Consequently, the voltage at the first node 104 can be based on the impedance of the first circuit. In some examples, the voltage at the first node 104 can be based on a capacitance of the first circuit. The timer duration circuit 102 can be configured to receive the voltage at the first node 104 and output the timer duration signal 106 in response to the received voltage exceeding or being equal to a first reference voltage. The timer duration signal 106 can define a time duration for a retry signal (e.g., for a pulse of the retry signal) based on a charge storage rate of the first circuit. The time duration of the retry signal can be representative of a retry delay ($T_{RT}$) (e.g., an amount of time between restarts) for the circuit protection device. The rate at which charge can be stored at the first circuit can be set based on the current at the first node 104 and the impedance of the first circuit. Accordingly, the timer duration signal 106 can define the retry delay $T_{RT}$ for the retry signal based on the impedance of the first circuit.

The system 100 can further include a logic circuit 110. The timer duration circuit 102 can be coupled to the logic circuit 110. The logic circuit 110 can be coupled to an integrator circuit 112 and configured to control (e.g., regulate) current from the integrator circuit 112 to a second node 114 based on one of the timer duration signal 106, the RTRS 108, or a combination thereof.

The logic circuit 110 can be configured to generate a retry signal 116 in response to receiving the RTRS 108 (e.g., a pulse of the RTRS 108). For example, the retry signal 116 outputted by the logic circuit 110 can have a pulse width that approximates the RTRS 108 when only the RTRS 108 is received by the logic circuit 110. The logic circuit 110 can be configured to adjust a pulse width (e.g., a pulse duration) of the retry signal 116 in response to receiving only the timer duration signal 106. Subsequent to the retry signal 116 being outputted (e.g., a portion of a pulse of the retry signal 116) and in response to receiving the timer duration signal 106 (e.g., a pulse of the timer duration signal 106) and the RTRS 108 (e.g., the pulse of the RTRS 108), the logic circuit 110 can cause the retry signal 116 to transition from a first state to a second different state, corresponding to adjusting the pulse width of the retry signal 116. As such, the logic circuit 110 can be configured to output a modified RTRS (e.g., a pulse width adjusted RTRS 108 signal) represented by the retry signal 116.

Additionally, the logic circuit 110 can be configured to receive the timer duration signal 106 (e.g., the pulse of the timer duration signal 106) while receiving the RTRS 108 (e.g., the pulse of the RTRS 108). The logic circuit 110 can be configured to adjust the pulse width of the retry signal 116 to cause the retry signal 116 to transition from the first state (e.g., "HIGH") to the second different state (e.g., "LOW"). Thus, the pulse width of the retry signal 116 can be adjusted in response to the logic circuit 110 receiving the timer duration signal 106. Accordingly, the pulse duration of the retry signal 116 being outputted by the logic circuit 110 can be set based on the timer duration signal 106.

The timer duration signal 106 can be generated based on the voltage at the first node 104 established by the first circuit. Because a rate that the voltage can be generated at the first node 104 by the first circuit can be based on the charge storage time of the first circuit, the pulse width (e.g., the cycle) of the retry signal 116 can be set based on the impedance of the first circuit that is coupled to the first node 104. Thus, the pulse width of the retry signal 116 can be set based on an impedance value (e.g., capacitance value) of the first circuit. Accordingly, the impedance of the first circuit can set the retry delay $T_{RT}$ for the circuit protection device. The logic circuit 110 can be configured to output the retry signal 116 with a pulse width over time intervals defined by the impedance of the first circuit and representative of the timer delay for the circuit protection device. The timer duration circuit 102 can be configured to receive a reset signal 118. In some examples, the reset signal 118 corresponds to a subsequent pulse of the FLT signal generated by the fault sensor. The timer duration circuit 102 can be configured to stop outputting the timer delay signal 106 in response to the reset signal 118.

In an example, a second external circuit (not shown in FIG. 1) can be coupled to the second node 114. The second circuit can include one or more capacitors. The integrator circuit 112 can be configured to provide the current to the second circuit during an active time of the retry signal 116 (e.g., during an active portion of the retry signal 116). For example, the second circuit can have an impedance and can be configured to store charge based on the current provided by the integrator circuit 112 during a pulse of the retry signal 116. Because each pulse of the retry signal 116 being outputted by the logic circuit 110 can be based on the impedance of the first circuit, and an amount of charge stored at the second circuit can be based on the impedance of the second circuit, the impedances (e.g., capacitances) of the first and second circuits coupled to respective nodes 104 and 114 can set a given number of retries ($N_P$) for the circuit protection device. That is, the impedances of the first and second circuits can be configured to establish a given number of retries $N_P$ (e.g., power cycles) for the circuit protection device.

In some examples, the amount of charge stored at the second circuit during the active time of the retry signal 116 can represent the number of retries that have occurred. Correspondingly, over a set of sequential time intervals, the amount of charge stored at the second node 114 (e.g., by the circuit coupled to such node) can increase from one time interval to the next and a new amount of charge stored can represent a new number of retries that have occurred for the circuit protection device. As such, in some examples, a voltage at the second node 114 based on the amount of charge stored by the second circuit can represent the number of retries that have occurred. In other examples, the second circuit can be charged and discharged repeatedly during each an active portion of the retry signal 116. During each active portion of the retry signal 116, the second circuit can be charged and discharged to establish voltage pulses at the second node 114. The voltage pulses at the second node 114 can be counted. A number of voltage pulses generated at the second node 114 can represent the number of retries that have occurred for the circuit protection device.

The system 100 can further include an output circuit 120. The output circuit 120 can be configured to output a stop retry signal 122 in response to reaching the given number of retries $N_P$. In some examples, the output circuit 120 can be configured to receive the voltage at the second node 114 established based on the amount of charge stored at the second circuit during each active portion of the retry signal 116 over time intervals. The output circuit 120 can be configured to evaluate the received voltage at the second node 114 and output the stop retry signal 122 based on the evaluation. In some examples, the output circuit 120 can be configured to compare the received voltage relative to a second reference voltage. The output circuit 120 can be configured to output the stop retry signal 122 based on the comparison. The output circuit 120 can be configured to output the stop retry signal 122 in response to the received voltage being equal to or greater than the second reference voltage.

In other examples, the output circuit 120 can be configured to count the number of voltage pulses during each active portion of the retry signal 116 over the time intervals. When a count value of the output circuit 120 reaches a count value corresponding to the given number of retries $N_P$ set for the circuit protection device, the output circuit 120 can be configured to output the stop retry signal 122. The stop retry signal 122 outputted by the output circuit 120 can indicate that the number of number of retries that have occurred is equal to the given number of retries $N_P$ set for the circuit protection device. The circuit protection device can be configured to stop restarting (e.g., power cycling) and turn off in response to the stop retry signal 122. In some examples, the stop retry signal 122 can be used to notify one or more other system components (e.g., a controller) that normal device operations conditions cannot be resumed as a result of the fault (e.g., overload).

Accordingly, the configurable auto retry system 100 can restart the circuit protection device according to the retry delay $T_{RT}$ until the given number of retries $N_P$ set for the circuit protection device have occurred. The configurable auto retry system 100 can be configured to set the retry delay $T_{RT}$ for the circuit protection device based on the impedance (e.g., capacitance) of the first external circuit coupled to the first node 104. The given number of retries $N_P$ for the circuit protection device can be set based on the impedances of the external circuits coupled to respective nodes 104,114 of the configurable auto retry system 100. By selecting appropriate external circuits for the system 100, the circuit protection device can be configured to more effectively monitor for faults, and a performance of the circuit protection device can be tailored to meet system requirements, which can improve the system (e.g., downtime).

Figure 2:
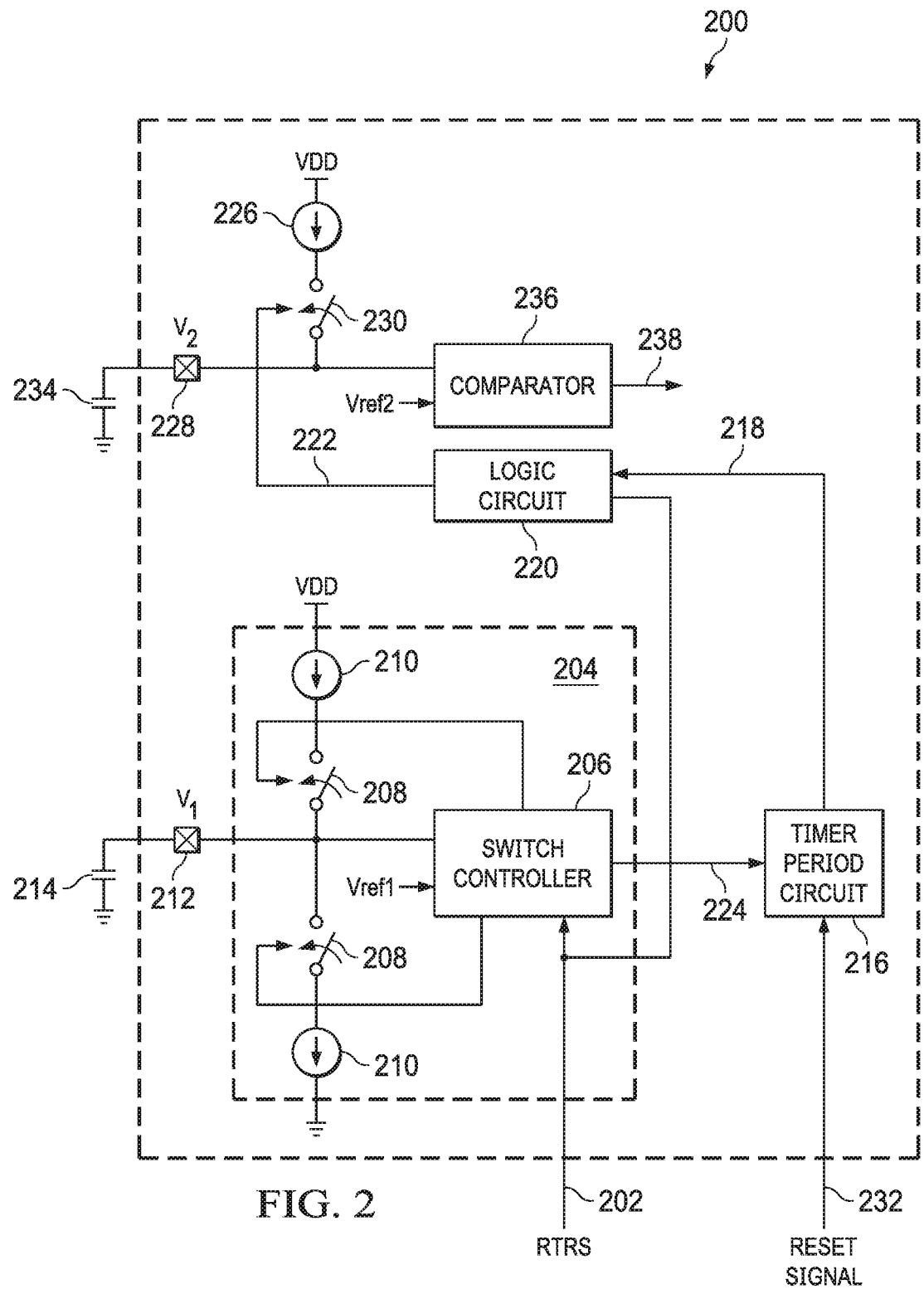
FIG. 2 illustrates another example of a configurable auto retry system.

FIG. 2 illustrates another example of a configurable auto retry system 200. The configurable auto retry system 200 can correspond to the configurable auto retry system 100 in the example of FIG. 1. Therefore, reference may be made to the example of FIG. 1 in the following description of the example of FIG. 2.

The system 200 can receive a restart retry timer signal (RTRS) 202. The RTRS 202 can correspond to the RTRS 108 in the example of FIG. 1. The RTRS 202 can be generated in response to an assertion of a fault (FLT) signal (not shown in FIG. 2). The FLT signal can be asserted (e.g. outputted) by a fault sensor (not shown in FIG. 2) in response to detecting the fault. For example, a retry timer oscillator (not shown in FIG. 2) of the circuit protection device can output the RTRS 202 in response to detecting the FLT signal. In some examples, the RTRS 202 can be generated in response to detecting a falling edge of a pulse of the FLT signal.

The system 200 can include an oscillator 204. The oscillator 204 can include a switch controller 206, switches 208, and current sources 210. The switches 208 can be coupled to the switch controller 206. The switch controller 206 can be configured to receive the RTRS 202. The switch controller 206 can be configured to control (e.g., open and close) the switches 208 based on the RTRS 202. The current sources 210 can be coupled to a voltage source VDD to receive a bias voltage. For example, each of the current sources 210 can be coupled in series with a respective one of the switches 208 between VDD and ground. Each current source 210 can be configured to supply a current to a first node 212 through a respective switch 208 in response to a switch control signal from the switch controller 206 based on the RTRS 202. The first node 212 can correspond to the first node 104 in the example of FIG. 1.

In some examples, an external capacitor 214 can be coupled to the first node 212. In a non-limiting example, the capacitor 214 can correspond to (e.g., form part of) the first external circuit described in context of the example of FIG. 1. In other examples, the capacitor 214 can represent a plurality of capacitors that can be connected in one of series, parallel, or combinations thereof. The capacitor 214 can be configured to store a charge based on the current at the first node 212 provided by current sources 210.

The current sources 210 can be configured to charge and discharge the capacitor 214 based on the current supplied through the switches 208 to generate a voltage $V_1$ at the first node 212. The charge stored at the capacitor 214 can be based on a capacitance of the capacitor 214. Consequently, the voltage $V_1$ generated at the first node 212 can be based on the capacitance of the capacitor 214 and the current being supplied. The oscillator 204 can be configured to cooperate with a timer period circuit 216 to output a timer duration signal 218 in response to the voltage $V_1$ at the first node 212 exceeding or being equal to a first reference voltage ($V_{ref1}$). The first reference voltage $V_{ref1}$ can be provided from a bus (not shown in FIG. 2). A logic circuit 220 can set a time duration for a retry signal 222 based on the timer duration signal 218, which depends on a charge storage rate of the capacitor 214. The time duration of the retry signal 220 can be representative of a retry delay ($T_{RT}$) (e.g., an amount of time between restarts) for the circuit protection device.

The charge storage rate (e.g., the rate at which charge is stored at the capacitor 214) can be based on the current provided by current sources 210 and the capacitance of the capacitor 214. Accordingly, the timer duration signal 218 can define the time duration for the retry signal 222 based on the capacitance of the capacitor 214. Because a rate that the voltage $V_1$ that can be generated at the first node 212 by the capacitor 214 is based on the charge storage time of the capacitor 214, a pulse width of the retry signal 222 (e.g., the pulse width of a pulse of the retry signal 222) can be set based on the capacitance of the capacitor 214. Thus, the pulse width of the retry signal 222 can be set based on a capacitance value of the capacitor 214. Accordingly, the capacitance of the capacitor 214 can set the retry delay $T_{RT}$ for the circuit protection device.

The switch controller 206 can be configured to compare the voltage at the first node 212 relative to the first reference voltage $V_{ref1}$. For example, the switch controller 206 can be configured to output a retry timer delay signal 224 to the timer period circuit 216 in response to the voltage at the first node 212 being equal to or greater than the first reference voltage $V_{ref1}$.

The timer period circuit 216 can be configured to modify (e.g., adjust) a period of the retry timer delay signal 224. For example, the timer period circuit 216 can be configured to adjust a time scale of the retry timer delay signal 224. In other examples, the timer period circuit 216 can be configured to multiply a frequency of the retry timer delay signal 224 by a multiplication factor (M). In such examples, the timer period circuit 216 can include a phase locked loop (PLL) circuit. The timer period circuit 216 can be configured to output the timer duration signal 218 based on the retry timer delay signal 224 and the multiplication factor M. The timer duration signal 218 can correspond to the timer duration signal 106 in the example of FIG. 1. Accordingly, the oscillator 204 and the timer period circuit 216 can be configured to cooperate to generate the timer duration signal 218 based on the capacitance of the capacitor 214 coupled to the first node 212.

In some examples, the oscillator 204, including the switch controller 206, the switches 208 and the current sources 210, and the timer period circuit 216 can correspond to (e.g., form part of) the timer duration circuit 102 in the example of FIG. 1.

The logic circuit 220 can be configured output the retry signal 222 based on one of the RTRS 202, the timer duration signal 218, or a combination thereof. In some examples, the logic circuit 220 can be implemented as a logic gate circuit 600, such as illustrated in an example of FIG. 6. The logic circuit 220 can be configured to control (e.g., regulate) current from a current source 226 to a second node 228 based on the retry signal 220. The logic circuit 220 can be coupled to a switch 230 to control the current provided by the current source 226 to the second node 228. In some examples, the current source 226 and the switch 230 can correspond to (e.g., form part of) the integrator circuit 112 in the example of FIG. 1. The current source 226 can be coupled to a voltage source VDD to receive a bias voltage.

The logic circuit 220 can be configured to generate the retry signal 222 in response to receiving the RTRS 202. In an example, the logic circuit 220 can output the retry signal 222 to have a pulse width that approximates a width of the RTRS 202 when only the RTRS 202 is received by the logic circuit 220. The logic circuit 220 can be configured to adjust the pulse width of the retry signal 222 in response to receiving the timer duration signal 218. The logic circuit 220 can be configured to transition the retry signal 222 from a first state to a second different state corresponding to adjusting the pulse width of the retry signal 222 in response to receiving the RTRS 202 (e.g., a pulse of the RTRS 202) and the timer duration signal 218 (e.g., a pulse of the timer duration signal 216). As such, the logic circuit 220 can be configured to output a modified RTRS (e.g., a pulse width adjusted RTRS 202 signal) represented by the retry signal 222. The logic circuit 220 can be configured to control the current provided by the current source 226 to the second node 228 by controlling the switch 230 based on the retry signal 222.

In some examples, the logic circuit 220 can be configured to detect a rising edge of the timer duration signal 218. The logic circuit 220 can be configured to adjust the pulse width of the retry signal 222 corresponding to causing the retry signal 222 to transition from the first state (e.g., "HIGH") to the second different state (e.g., "LOW") in response to detecting the rising edge. Thus, the logic circuit 220 can adjust the pulse width of the retry signal 222 in response to receiving the timer duration signal 218 and the RTRS 202. Accordingly, the time duration of the retry signal 222 can be set based on the timer duration signal 218.

In some examples, the timer period circuit 216 can receive a reset signal 232. In some examples, the reset signal 232 can correspond to a subsequent pulse of the FLT signal generated by the fault sensor. The timer period circuit 216 can be configured to stop outputting the timer duration signal 218 in response to receiving to the subsequent pulse of the FLT signal. The logic circuit 220 can be configured to output another pulse of the retry signal 222 in response to the timer period circuit 216 not outputting the timer duration signal 218 to cause the switch 230 to provide the current to the node 228.

In an example, an external capacitor 234 can be coupled to the second node 228. The capacitor 234 can correspond to the second external circuit, such as to form part of the second external circuit described in context of the example of FIG. 1. In other examples, the capacitor 234 can represent a plurality of capacitors that can be connected in one of series, parallel, or a combination thereof. The current source 226 can be configured to provide the current to the capacitor 234 during an active time of the retry signal 222 (e.g., over an active portion of the pulse of the retry signal 222) when the switch 230 is closed. The capacitor 234 can be configured to store charge based on the current provided by the current source 226 during the active time of the retry signal 222. Because a pulse width of each pulse of the retry signal 222 being outputted by the logic circuit 220 can be based on the capacitance of the capacitor 214, and an amount of charge stored at the capacitor 234 can be based on a capacitance of the capacitor 234, the capacitances of the capacitors 214, 234 can set a given number of retries ($N_P$) for the circuit protection device. Accordingly, the capacitances of the capacitors 214, 234 can set the given number of retries $N_P$ (e.g., power cycles) for the circuit protection device.

In some examples, the amount of charge stored at the capacitor 234 during the active time of the retry signal 222 can represent a number of retries that have occurred. The amount of charge stored at the capacitor 234 can change from one time interval to the next, and a new amount of charge stored can represent a new number of retries that have occurred. As such, a voltage $V_2$ at the node 228 (across the capacitor 234) can represent the number of retries that have occurred for the circuit protection device.

The system 200 can further include a comparator 236. The comparator 236 can be configured to output a stop retry signal 238 to indicate that the number of retries $N_P$ set for the circuit protection has been reached. For example, the comparator 236 has an input to receive the voltage $V_2$ at the second node 228 established based on the charge stored at the capacitor 234. The comparator 236 can be configured to compare the received voltage $V_2$ at the second node 228 relative to a second reference voltage ($V_{ref2}$), which is received at another input of the comparator 236. The second reference voltage $V_{ref2}$ can be provided from a bus (not shown in FIG. 2). The comparator 236 can be configured to output the stop retry signal 238 in response to the voltage at the second node 228 being equal to or greater than the second reference voltage $V_{ref2}$.

The time duration of each cycle of retry signal 222 representative of the retry delay $T_{RT}$ for the circuit protection device, can be represented by the following equation:

$$T_{RT}=2*C_1*V_{ref1}*M/I_1 \quad (1),$$

wherein $T_{RT}$ is the time duration of each pulse of the retry signal 222, $C_1$ is the capacitance of the capacitor 214, $V_{ref1}$ is the first reference voltage, M is the multiplication factor provided by the timer period circuit 216, and $I_1$ is the current at the first node 212 provided by the current sources 210.

The voltage $V_2$ at the second node 228 established based on the charge stored at the capacitor 234 based on the current provided by the current source 226 can be represented by the following equation:

$$V_2=T_{RT}*I_2/C_2 \quad (2),$$

wherein $V_2$ is the voltage at the second node 228, wherein $T_{RT}$ is the time duration of each pulse of the retry signal 218, $I_2$ is the current provided by the current source 226 at the second node 228, and $C_2$ is the capacitance of capacitor 234.

The given number of retries $N_P$ set for the circuit protection device can be represented by the following equation:

$$N_P = V_{ref2}/V_2 \quad (3),$$

wherein $N_P$ is the given number of retries set for the circuit protection device, $V_{ref2}$ is the second reference voltage, and $V_2$ is the voltage at the second node 228.

From equations (1), (2), and (3), the number of retries $N_P$ for the circuit protection device can be further represented by the following equation:

$$N_P = \frac{V_{ref2} * C_2 * I_1}{2 * V_{ref1} C_1 * I_2 * M_1}, \quad (4)$$

Accordingly, from equation (4), the given number of retries $N_P$ for the circuit protection device can be set based on a ratio of capacitances ($C_2/C_1$) of the external capacitors 214,234.

The configurable auto retry system 200 can restart (e.g., power cycle) the circuit protection device according to the retry delay $T_{RT}$ until the given number of retries $N_P$ that have been set for the device have occurred. The system 200 can be configured to set the retry delay $T_{RT}$ for the circuit protection device based on the capacitance of the external capacitor 214 coupled to the first node 212 of the configurable auto retry system 200. The given number of retries $N_P$ for the circuit protection device can be set based on the capacitances of the external capacitors 214,234 coupled to respective nodes 212,228. By selecting appropriate external capacitors for the auto retry system 200 and correspondingly the circuit protection device, the device can be configured to more effectively monitor for faults, and a performance of the circuit protection device can be tailored to meet system requirements and thereby improve system downtime.

Figure 3:
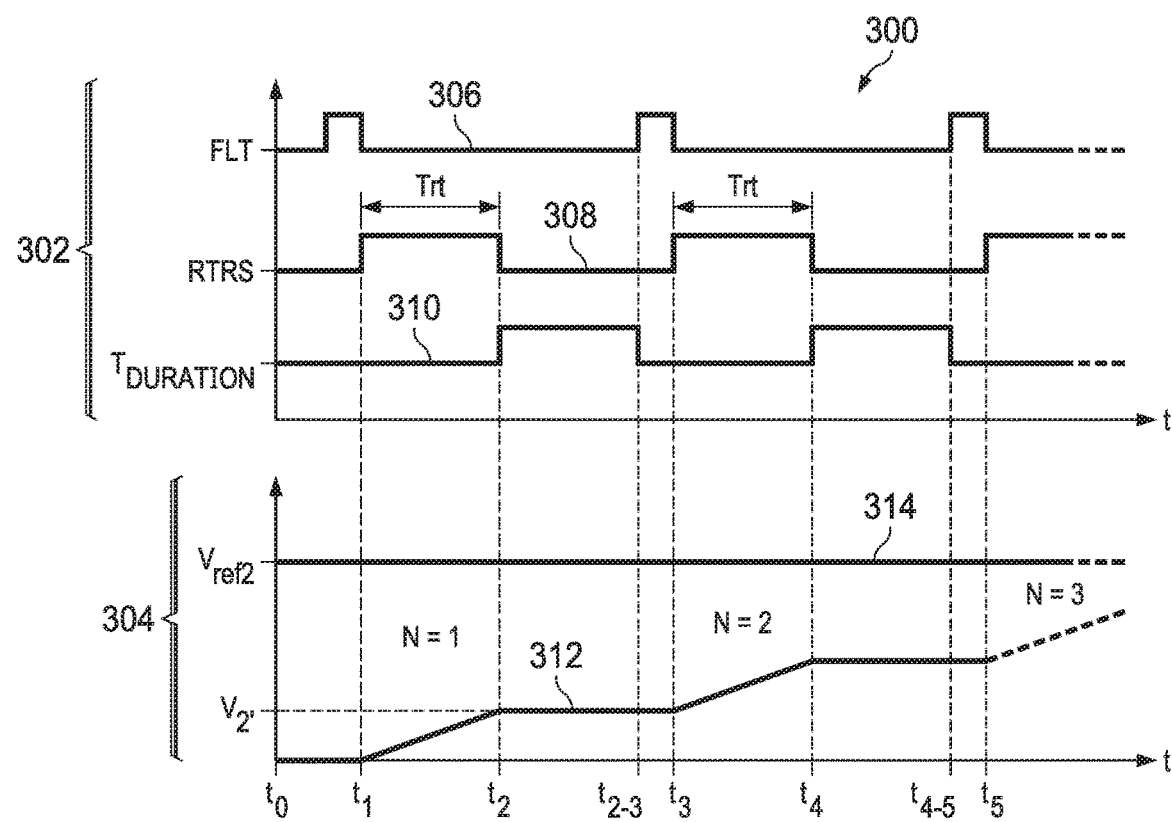
FIG. 3 illustrates an example of a timing and voltage diagram.

FIG. 3 illustrates an example of a timing and voltage diagram 300. The timing and voltage diagram 300 can be associated with operation of the configurable auto retry system 100 in the example of FIG. 1, or the configurable auto retry system 200 in the example of FIG. 2. Therefore, reference may be made to the example of FIGS. 1 and 2 in the following description of the example of FIG. 3. The timing and voltage diagram 300 includes an upper portion 302 and a lower portion 304.

The upper portion 302 demonstrates a timing relationship between a fault (FLT) signal 306 (referred to as "FLT" in the upper portion 302), a retry timer signal (RTRS) signal 308 (referred to as "RTRS" in the upper portion 302), and a timer duration signal 310 (referred to as "$T_{DURATION}$" in the upper portion 302), as described with respect to the examples of FIGS. 1 and 2 over time intervals. The lower portion 304 demonstrates a voltage 312 at the second node 228 established by the capacitor 234 based on the stored charged relative to the timing diagram in the upper portion 302 over the time intervals. The voltage 312 can correspond to the voltage $V_2$ in the example of FIG. 2.

Between a time $t_0$ and a time $t_1$ (e.g., a time interval), the fault sensor can be configured to output a first pulse of the FLT signal 306 indicative of a fault. At a time $t_1$, the retry timer oscillator circuit can be configured to output a first pulse of the RTRS 308 (e.g., the RTRS 202) based on the first pulse of the FLT signal 306. As described herein, the retry signal 222 outputted by the logic circuit 220 can have a time duration ($T_{RT}$) (e.g., a pulse width) that approximates a pulse width of the RTRS 202. Thus, a time duration of the pulse width of the RTRS 202 can correspond to the time duration of the retry signal 222, and thus can represent the timer delay $T_{RT}$ for the circuit protection device. Accordingly, the retry signal 222 can correspond to the RTRS 308. At a time $t_1$, as illustrated in the lower portion 304, the capacitor 234 can establish the voltage 312 at the second node 228 based on an amount of charge stored at the capacitor 234. The voltage 312 at the second node 228 can rise over the first pulse of the RTRS 306 until time $t_2$ at which the voltage 312 at the node is equal to $V_{2'}$.

At time $t_2$, the logic circuit 220 can be configured to receive a first pulse of the timer duration signal 310 (e.g., the timer duration signal 218). As described herein, the timer duration signal 310 can be outputted by a timer multiplier circuit (e.g., the timer multiplier circuit 216). The logic circuit 220 can be configured to stop outputting a first pulse of the retry signal 222 in response to receiving the first pulse of the timer expiration signal 310. As such, at time $t_2$, the retry signal 222 can transition from high to low corresponding to transitioning the first pulse of the RTRS 308 from high to low, as illustrated in the upper portion 302. The amount of charge stored at the capacitor 234 at time $t_2$ and correspondingly the voltage 312 can be indicative of a first retry (N=1, as illustrated in the lower portion 304). Between time $t_2$ and time $t_3$, as illustrated in the lower portion 304, the capacitor 234 can substantially hold the stored charge. Resultantly, the voltage 312 at the second node 228 established based on the charge stored at the capacitor 234 over a time interval between time $t_2$ and time $t_3$ can represent a first retry. Accordingly, the capacitor 234 can serve as a memory of a number of retries that have occurred for the circuit protection device.

At a given instance of time $t_{2-3}$ between time $t_2$ and time $t_3$, the fault sensor can be configured to output a second pulse of the FLT signal 306 indicative of the fault. In some examples, the second pulse of the FLT signal 306 can correspond to the reset signal 232. The second pulse of the FLT signal 306 can be provided to the timer period circuit 216. For example, the timer period circuit 216 can be configured to stop outputting the first pulse of the timer expiration signal 310 in response to receiving the second pulse of the FLT signal 306. As such, at the given instance of time, as illustrated in the upper portion 302, the first pulse of the timer expiration signal 310 can transition from high to low.

At time $t_3$, the retry timer oscillator circuit can be configured to output a second pulse of the RTRS signal 308 based on the second pulse of the FLT signal 306. Further, at time $t_3$, as illustrated in the lower portion 304, the voltage 312 at the second node 228 can rise over the second pulse of the RTRS 308 until time $t_4$. At this time, a second pulse of the timer expiration signal 310 can be provided to the logic circuit 220. The logic circuit 220 can be configured to stop outputting a second pulse of the retry signal 222 in response to receiving the second pulse of the timer expiration signal 310. As such, at time $t_4$, the second pulse of the retry signal 222 can transition from high to low corresponding to transitioning the second pulse of the RTRS 308 from high to low, as illustrated in the upper portion 302. A new amount of charge stored at the capacitors 234 at time $t_4$ and correspondingly the voltage 312 can be indicative of a second retry (N=2, as illustrated in the lower portion 304). Between time $t_4$ and time $t_5$, as illustrated in the lower portion 304, the capacitor 234 substantially holds the charge and acts as memory to remember that two retries have occurred for the circuit protection device.

At a given instance of time $t_{4-5}$ between time $t_4$ and time $t_5$, the fault sensor can be configured to output a third pulse of the FLT signal 306 indicative of the fault. In some examples, the third pulse of the FLT signal 320 can correspond to the reset signal 232. The third pulse of the FLT signal 306 can be provided to the timer period circuit 216. The timer period circuit 216 can be configured to stop outputting the second pulse of the timer expiration signal 310 in response to receiving the third pulse of the FLT signal 306. As such, at the given instance of time $t_{4-5}$, as illustrated in the upper portion 302, the second pulse of the timer expiration signal 310 can transition from high to low.

The amount of charge stored at the external capacitor 234 can increase from one time interval to the next (e.g., N=3, as illustrated in the lower portion 304) and a new amount of charge stored at the capacitor 234 during a given time interval can be representative of the number of retries that have occurred for the circuit protection device. For example, after ten time intervals, the amount of charge stored at the capacitor 234 can be a given amount and can indicate that five retries (e.g., power cycles) have occurred for the circuit protection device. The voltage 312 at the second node 228 can increase over the time intervals until the voltage 312 is equal to or substantially equal to a reference voltage 314 (e.g., the second reference voltage $V_{ref2}$). The comparator 236 can be configured to output the stop retry signal 238 in response to the voltage 312 being equal to or substantially equal to the reference voltage 314. The stop retry signal 238 can indicate that a given number of retries $N_P$ have occurred for the circuit protection device. The given number of retries $N_P$ can be defined for the circuit protection device based on the capacitances of the capacitors 214,234.

Figure 4:
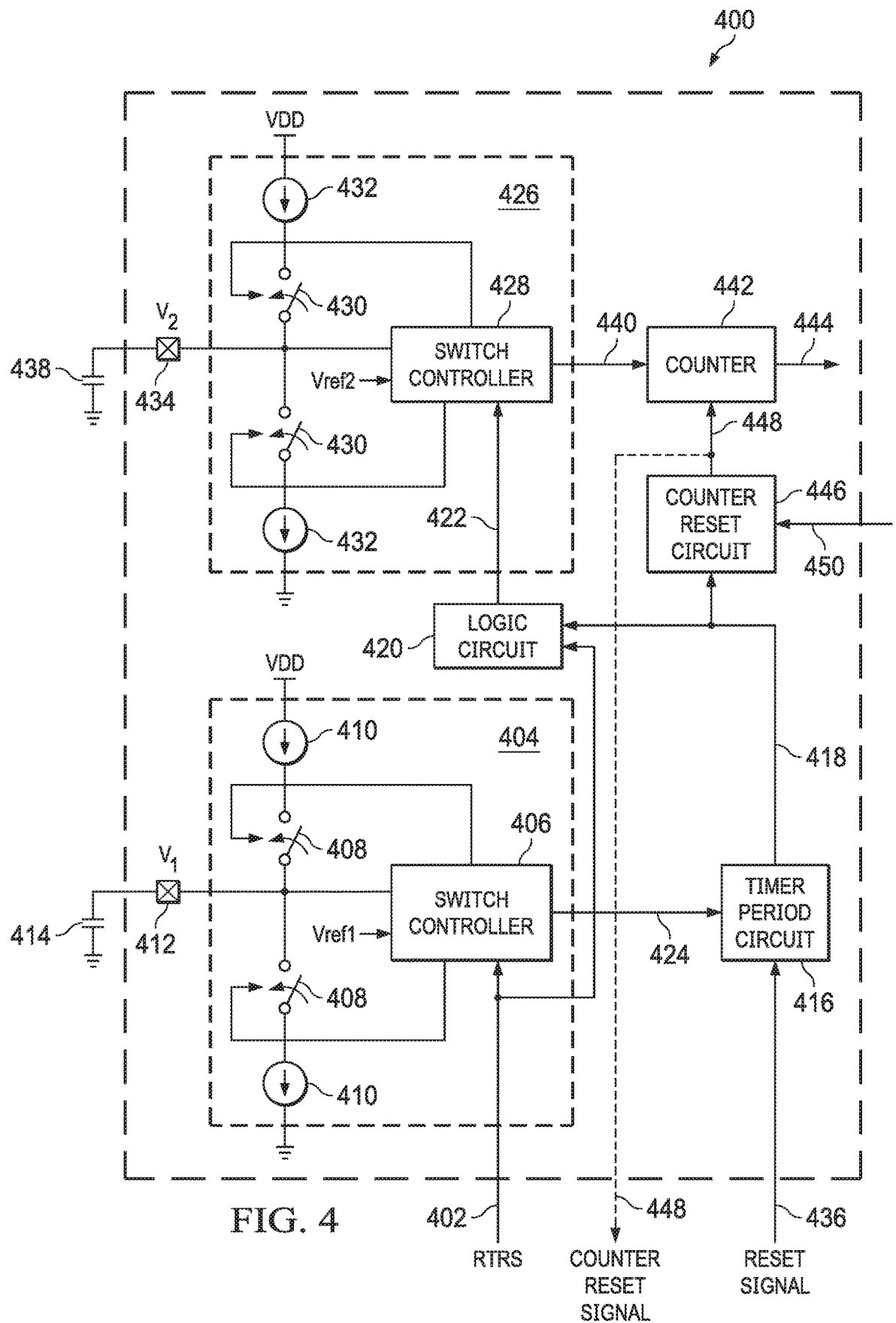
FIG. 4 illustrates yet an even further example of a configurable auto retry system.

FIG. 4 illustrates another example of a configurable auto retry system 400 for a circuit protection device. The configurable auto retry system 400 can correspond to the configurable auto retry system 100 in the example of FIG. 1. Therefore, reference may be made to the example of FIG. 1 in the following description of the example of FIG. 4.

The system 400 can receive a retry timer signal (RTRS) 402. The RTRS 402 can correspond to the RTRS 108 in the example of FIG. 1. The RTRS 202 can be generated in response to an assertion of a fault (FLT) signal (not shown in FIG. 4). The FLT signal can be asserted (e.g. outputted) by a fault sensor (not shown in FIG. 4). In some examples, the circuit protection device can include the fault sensor. The fault sensor can be configured to monitor for a fault and assert the FLT signal in response to detecting the fault. For example, a retry timer oscillator circuit (not shown in FIG. 4) of the circuit protection device can output the RTRS 402 in response to detecting the FLT signal. In some examples, the RTRS 402 can be generated in response to detecting a falling edge of the FLT signal.

The system 400 can include an oscillator 404. The oscillator 404 can include a switch controller 406, switches 408 and current sources 410. The switch controller 406 can be coupled to the switches 408. The switch controller 406 can be configured to receive the RTRS 402. The switch controller 406 can be configured to control (e.g., open and close) the switches 408 based on the RTRS 402. The current sources 410 can be coupled to a voltage source VDD to receive a bias voltage. For example, each of the current sources 410 can be coupled in series with a respective one of the switches 408 between VDD and ground. Each current source 410 can be configured to supply a current to a first node 412 through a respective switch 408 in response to a switch control signal from the switch controller 404. The first node 412 can correspond to the first node 104 in the example of FIG. 1.

In some examples, an external capacitor 414 can be coupled to the first node 412. In an example, the capacitor 414 can correspond to the first circuit (e.g., form part of) described in context of the example of FIG. 1. In other examples, the capacitor 414 can represent a plurality of capacitors that can be connected in one of series, parallel, or a combination thereof. The capacitor 414 can be configured to store a charge based on the current at the first node 412 provided by the current sources 410.

The current sources 410 can be configured to charge and discharge the capacitor 414 based on the current supplied through the switches 408 to generate a voltage $V_1$ at the first node 412. The charge stored at the capacitor 414 can be based on a capacitance of the capacitor 414. Consequently, the voltage $V_1$ generated at the first node 412 can be based on the capacitance of the capacitor 414 and the current supplied. The oscillator 404 can be configured to cooperate with a timer period circuit 416 to output a timer duration signal 418 in response to the voltage at the first node 412 exceeding or being equal to a first reference voltage ($V_{ref1}$). The first reference voltage $V_{ref1}$ can be provided from a bus (not shown in FIG. 4). A logic circuit 420 can set a time duration for a retry signal 422 based on the timer duration signal 418, which depends on a charge storage rate of the capacitor 414.

The charge storage rate (e.g., a rate at which charge is stored at the capacitor 414) can be based on the current provided by the current sources 410 and the capacitance of the capacitor 414. Accordingly, the timer duration signal 418 can define the time duration $T_{RT}$ for the retry signal 422 based on the capacitance of the capacitor 414. The time duration of the retry signal 422 can be representative of a retry delay ($T_{RT}$) (e.g., an amount of time between restarts) for the circuit protection device. Because a rate that the voltage $V_1$ that can be generated at the first node 412 by the capacitor 414 is based on the charge storage time of the capacitor 414, a pulse width of the retry signal 422 (e.g., a pulse of the retry signal 422) can be set based on the capacitance of the capacitor 414. Thus, the pulse width of the retry signal 422 can be set based on a capacitance value of the capacitor 414. Accordingly, the capacitance of the capacitor 414 can set the retry delay $T_{RT}$ for the circuit protection device.

The switch controller 406 can be configured to compare the voltage $V_1$ at the first node 412 relative to a first reference voltage ($V_{ref1}$). For example, the switch controller 406 can be configured to output a retry timer delay signal 424 in response to the voltage $V_1$ at the first node 412 being equal to or greater than the first reference voltage $V_{ref1}$. The timer period circuit 416 can be configured to modify (e.g., adjust) a period of the retry timer delay signal 424. For example, the timer period circuit 416 can be configured to adjust a time scale of the retry timer delay signal 424. In other examples, the timer period circuit 416 can be configured to multiply a frequency of the retry timer delay signal 424 by a multiplication factor (M). The timer period circuit 416 can be configured to output the timer duration signal 418 based on the retry timer delay signal 424 and the multiplication factor M. The timer duration signal 418 can correspond to the timer duration signal 106 in the example of FIG. 1. Accordingly, the oscillator 404 and the timer period circuit 416 can be configured to cooperate to generate the timer duration signal 418 based on the capacitance of the capacitor 414 coupled to the first node 412.

In some examples, the oscillator 404, including the switch controller 406, switches 408 and the current sources 410, and the timer period circuit 416 can correspond to (e.g., form part of) the timer duration circuit 102 in the example of FIG. 1.

The logic circuit 420 can be configured to output the retry signal 422 based on one of the RTRS 402, the timer duration signal 418, or a combination thereof. In some examples, the logic circuit 420 can be implemented as a logic gate circuit 600, such as illustrated in an example of FIG. 6. The logic circuit 420 can be coupled to an oscillator 426. The oscillator 426 can include a switch controller 428, switches 430, and current sources 432. The switch controller 428 can be coupled to the switches 430 and configured to control the switches 430 based on the retry signal 422. Each of the current sources 432 can be coupled to a respective switch 430 in series between a voltage source $V_{DD}$ and electrical ground. Each current source 432 can be configured to supply a current to a second node 434 of the system 400 in response to the switch controller 428 selectively controlling a respective switch 430. For example, the switch controller 428 operates each of the switches 430 in an alternating manner so that the current is sourced to and sunk from the second node 434 according to operation of the switches 430. In some examples, the second node 434 can correspond to the second node 114 in the example of FIG. 1.

The logic circuit 420 can be configured to generate the retry signal 422 (e.g., a pulse of the retry signal 422) in response to receiving the RTRS 402 (e.g., a pulse of the RTRS 402). For example, the retry signal 422 outputted by the logic circuit 420 can have a pulse width that approximates a width of the RTRS 402 when only the RTRS 402 is received by the logic circuit 420. The logic circuit 420 can be configured to adjust a pulse width (e.g., a pulse duration) of the RTRS 402 in response to receiving the timer duration signal 418 (e.g., a pulse of the timer duration signal 418). The logic circuit 420 can be configured to cause the retry signal 422 to transition from a first state to a second different state, corresponding to adjusting the pulse width of the retry signal 422, in response to receiving the RTRS 402 and the timer duration signal 418. As such, the logic circuit 420 can be configured to output a modified RTRS (e.g., a pulse width adjusted RTRS 402 signal) represented by the retry signal 422. The logic circuit 420 can be configured to control the switch controller 428 to control the current provided by the current sources 432 to the second node 434 based on the retry signal 422.

In some examples, the logic circuit 420 can be configured to detect a rising edge of the timer duration signal 418. The logic circuit 420 can be configured to adjust a pulse width of the retry signal 422 in response to detecting the rising edge, corresponding to causing the retry signal 422 to transition from the first state (e.g., "HIGH") to the second different state (e.g., "LOW"). Thus, the logic circuit 420 can adjust the pulse width of the retry signal 422 in response to receiving the timer duration signal 418. Additionally, each pulse width of the retry signal 422 being outputted by the logic circuit 420 can be set based on the timer duration signal 418.

In some examples, the timer period circuit 416 can receive a reset signal 436. In some examples, the reset signal 436 can correspond to a pulse of the FLT signal generated by the fault sensor. The timer period circuit 416 can be configured to stop outputting the timer duration signal 418 in response to receiving to the pulse of the FLT signal. The logic circuit 420 can be configured to output another pulse of the retry signal 422 in response to the timer period circuit 416 not outputting the timer duration signal 418.

In an example, an external capacitor 438 can be coupled to the second node 434. The capacitor 438 can correspond to the second circuit, such as to form part of the second external circuit described in context of the example of FIG. 1. In other examples, the capacitor 438 can represent one or more capacitors connected in one of series, parallel, or a combination thereof. The current sources 432 can be configured to provide the current to the capacitor 438 during the active time of the retry signal 422 being outputted by the logic circuit 420. The capacitor 438 can be configured to store charge based on the current provided by the current sources 432 during the active time of the retry signal 422. Because the retry signal 422 being outputted by the logic circuit 420 can be based on the capacitance of the capacitor 414, and an amount of charge stored at the capacitor 438 can be based on a capacitance of the capacitor 438, the capacitances of the capacitors 414,438 can set a given number of retries ($N_P$) for the circuit protection device. For example, the capacitances of the capacitors 414,438 can define a given number of retries $N_P$ (e.g., power cycles) for the circuit protection device.

During the active portion of the retry signal 422, the capacitor 438 coupled to the second node 434 can be charged and discharged a number of times based on the current provided by the current sources 432. The capacitor 438 can be charged to establish voltage pulses $V_2$ at the second node 434 ranging between a lower reference voltage ($V_{refl}$) and an upper voltage reference ($V_{refu}$) during the active portion of the retry signal 422. The switch controller 428 can be configured to compare each voltage pulse $V_2$ at the second node 434 to a second reference voltage ($V_{ref2}$). The second reference voltage $V_{ref2}$ can be provided from a bus (not shown in FIG. 4). For example, the switch controller 428 can be configured to output a count pulse signal 440 for each voltage pulse $V_2$ that is equal to or greater than the second reference voltage $V_{ref2}$.

The system 400 can further include a counter 442. The counter 442 can be configured to count the count pulse signals 440 generated by the switch controller 428 (e.g., during each pulse of the retry signal 422). A given number of count pulse signals 440 can indicate a number of retries that have occurred for the circuit protection device. For example, a number (e.g., four or eight or other number) of the count pulse signals 440 can be used to increment a count value of the counter 442. As such, the count value of the counter 442 can represent the number of retries that have occurred for the circuit protection device. When the count value of the counter 442 reaches a given count value corresponding to the given number of retries $N_P$ set for the circuit protection device, the counter 442 can overflow and output a stop retry signal 444. The stop retry signal 444 indicates that the number of retries $N_P$ that have been set for the circuit protection device have occurred.

A time period $T_2$ of the voltage $V_2$ at the second node 434 can be represented by the following equation:

$$T_2 = 2 * V_{ref2} * C_2 / I_2 \qquad (5),$$

wherein $T_2$ is the time period of the voltage at the second node 434, $C_2$ is the capacitance of the capacitor 438, $V_{ref2}$ is the second reference voltage and is equal to $V_{refu} - V_{refl}$, and $I_2$ is the current at the second node 434 provided by the current sources 432.

The time duration of each cycle of the retry signal 422 representative of the retry delay $T_{RT}$ for the circuit protection device can be represented by the following equation:

$$T_{RT} = D / N_P * T_2 \qquad (6),$$

wherein $T_{RT}$ is the time duration corresponding to the retry delay for each pulse of the retry signal 422, D is a number of charge-discharge cycles of the capacitor 438 during each pulse of the retry signal 422, $N_P$ is the given number of retries set for the circuit protection device based on the capacitances of the capacitors 414,438, and $T_2$ is the time period of the voltage $V_2$ at the second node 434.

From equations (1), (5), and (6), the given number of retries $N_P$ set for the circuit protection device can be represented by the following equation:

$$N_P = \frac{D * V_{ref2} * C_2 * I_1}{M_1 * V_{ref1} * C_1 * I_2}, \tag{7}$$

In some examples, the first and second voltage references $V_{ref1}$ and $V_{ref2}$ can be substantially equal. As such, equation (7) can further be reduced as follows:

$$N_P = \frac{D * C_2 * I_1}{M_1 * C_1 * I_2}, \tag{8}$$

In some examples, the configurable auto retry system 400 can include a counter reset circuit 446. The counter reset circuit 446 can be configured to clear the counter 442 (e.g., set the count value to zero). For example, the counter reset circuit 446 can be configured to clear the counter 442 to remove unwanted count errors that may occur during powering of the circuit protection device. During power-up, for example, the circuit protection device can experience unexpected transient events that can cause the counter 442 inadvertently to increment the count value. During normal operations of the circuit protection device, it is desirable that the count value is at zero such that the stop retry signal 444 is not outputted by the counter 442 before the given number of retries $N_P$ set for the circuit protection device have occurred.

The counter reset circuit 446 can be coupled to the timer period circuit 416 to monitor for the timer duration signal 418. In response to detecting a pulse of the timer duration signal 418, the counter reset circuit 446 can be configured to monitor for a subsequent pulse of the timer duration signal 418. If the subsequent pulse of the timer duration signal 418 is not outputted by the timer period circuit 416 within a given amount of time (e.g., a time delay) relative to when a prior pulse of the timer duration signal 418 was outputted by the timer period circuit 416, the counter reset circuit 446 can be configured to output a counter reset signal 448. The counter reset signal 448 can be provided to the counter 442 to clear the count value (e.g., set the count value to zero).

As a further example, the counter reset circuit 446 can be configured to output the counter reset signal 448 based on a time difference signal 450. The time difference signal 450 can define an amount of time between pulses of the timer duration signal 418. Thus, the time delay can be a multiplication factor (R) of the retry delay $T_{RT}$ set for the circuit protection device based on the capacitance of the capacitor 414. Thus, for example, if R=7, and the next fault event and thus a subsequent pulse of the timer duration signal 416 does not occur within 7*$T_{RT}$, the counter reset circuit 446 can be configured to output the counter reset signal 448. In some examples, the counter reset signal 448 (as illustrated in FIG. 4 with a dashed line) can be outputted to the retry timer oscillator of the circuit protection device. For example, the retry timer oscillator can be configured to stop outputting the RTRS 402 in response to receiving the counter reset signal 448. Accordingly, the counter reset circuit 446 can be configured to output the counter reset signal 448 based on the amount of time between pulses of the timer duration signal 418. The counter 442 can be configured to clear the count value in response to the counter reset signal 448.

In some examples, the counter reset circuit 446 can include a number of flip-flop circuits (e.g., D flip-flop circuits) that can be configured to provide the time delay. As an example, the number of flip-flop circuits can be determined by the following equation:

$$D = \log_2(R+1) \tag{9},$$

wherein D is the number of flip-flops circuits, and R is the multiplication, as defined by the time difference signal 450.

Accordingly, the configurable auto retry system 400 offers scalability in terms of configurability for a timer delay $T_{RT}$ and a number of retries for the circuit protection device, and allows users to tailor circuit protection devices more specifically to ensure that systems can effectively meet normal operating conditions and/or parameters. The configurable auto retry system 400 can be configured to set the retry delay $T_{RT}$ for the circuit protection device based on the capacitance of the external capacitor 414 coupled to the first node 412 of the configurable auto retry system 400. The given number of retries $N_P$ can be set for the circuit protection device by configuring the system 400 with external capacitors 414, 438 having appropriate capacitance values.

FIG. 5 illustrates an example of a timing and voltage diagram 500. The timing and voltage diagram 500 can be associated with operation of the configurable auto retry system 100 in the example of FIG. 1, or the configurable auto retry system 400 in the example of FIG. 4. Therefore, reference may be made to the example of FIGS. 1 and 4 in the following description of the example of FIG. 5. The timing and voltage diagram 500 includes an upper portion 502 and a lower portion 504.

The upper portion 502 demonstrates a timing relationship between a fault (FLT) signal 506 (referred to as "FLT" in the upper portion 502), a retry timer signal (RTRS) 508 (referred to as "RTRS" in the upper portion 502), and a timer duration signal 510 (referred to as "$T_{DURATION}$" in the upper portion 502), as described with respect to the examples of FIGS. 1 and 2 over time intervals. The lower portion 504 demonstrates a voltage 512 at the second node 434 established by the capacitor 438 based on the stored charged relative to the timing diagram in the upper portion 502 for the time intervals.

Between a time $t_0$ and a time $t_1$, the fault sensor can be configured to provide a first pulse of the FLT signal 506 indicative of a fault. At a time $t_1$, the retry timer oscillator circuit can be configured to output a first pulse of the RTRS 508 (e.g., the RTRS 402) based on the first pulse of the FLT signal 506. As described herein, the retry signal 422 outputted by the logic circuit 420 can have a time duration ($T_{RT}$) (e.g., a pulse width) that approximates a pulse width of the RTRS 402. Thus, a time duration of the pulse width of the RTRS 402 can correspond to the time duration of the retry signal 422, and thus can represent the timer delay $T_{RT}$ for the circuit protection device. Accordingly, the retry signal 422 can correspond to the RTRS 508. At a time $t_1$, as illustrated in the lower portion 504, the capacitor 438 can establish a voltage 512 at the second node 434 based on an amount of charge stored at the capacitor 438.

Between time $t_1$ and time $t_2$, the capacitor 438 can be charged and discharged repeatedly during the first pulse of the RTRS 508. As illustrated in the lower portion 504, during the first pulse of the RTRS 508, the capacitor 438 can be charged and discharged repeatedly to establish voltage pulses 512 ranging between a lower reference voltage $V_{ref1}$ and an upper voltage reference $V_{refu}$. Each voltage pulse 512 can be compared relative to the second reference voltage $V_{ref2}$. The oscillator 426 (e.g., the switch controller 428) can be configured to output the count pulse signal 440 for each voltage pulse 512 that is equal to or greater than the second reference voltage $V_{ref2}$. The counter 442 can be configured to count a number of count pulse signals 440 generated by the oscillator 426 during the first pulse of the RTRS 508. A number of count pulse signals (e.g., five) can indicate a number of retries that have occurred for the circuit protection device. The counter 442 can serve as a memory of the number of retries that have occurred for the circuit protection device. A count value of the counter 442 can represent the number of retries that have occurred.

At time $t_2$, the logic circuit 420 can be configured to receive a first pulse of the timer duration signal 510 (e.g., the timer duration signal 418). The first pulse of the timer duration signal 510 can be outputted by the timer period circuit 416. The logic circuit 420 can be configured to stop outputting a first pulse of the retry signal 422 in response to receiving the first pulse of the time duration signal 510. As such, at time $t_2$, the first pulse of the retry signal 422 can transition from high to low corresponding to transitioning the first pulse of the RTRS 508 from high to low, as illustrated in the upper portion 502. Resultantly, at time $t_2$, the capacitor 438 can discharge. Between time $t_2$ and time $t_3$, as illustrated in the lower portion 504, the voltage 512 can be substantially zero (e.g., at a voltage level below the lower reference voltage $V_{refl}$).

At an instance of time $t_{2-3}$ between time $t_2$ and time $t_3$ (e.g., a time interval), the fault sensor can be configured to provide a second pulse of the FLT signal 506 indicative of the fault. In some examples, the second pulse of the FLT signal 506 can correspond to the reset signal 436. The second pulse of the FLT signal 506 can be provided to the timer period circuit 416. The timer period circuit 416 can be configured to stop outputting the first pulse of the timer duration signal 510 in response to receiving the second pulse of the FLT signal 506. As such, at the instance of time $t_{2-3}$, as illustrated in the upper portion 502, the first pulse of the timer duration signal 510 can transition from high to low.

At time $t_3$, the retry timer oscillator circuit can be configured to output a second pulse of the RTRS 508 based on the second pulse of the FLT signal 506. Between time $t_3$ and time $t_4$ as illustrated in the lower portion 504, the capacitor 438 can be charged and discharged repeatedly during the second pulse of the RTRS 508. As illustrated in the lower portion 504, during the second pulse of the RTRS 508, the capacitor 438 can be charged and discharged repeatedly to establish the voltage pulses 512 during the second pulse of the RTRS 508. The oscillator 426 (e.g., the switch controller 428) can be configured to compare each voltage pulse 512 to the second reference voltage $V_{ref2}$. The oscillator 426 can be configured to output the count pulse signal 440 for each voltage pulse 512 that is equal to or greater than the second reference voltage $V_{ref2}$. The counter 442 can be configured to increase the count value based on each count pulse signal 440 outputted by the oscillator 426. A current count value can indicate a number of retries that have occurred for the circuit protection device.

At time $t_4$, the logic circuit 420 can be configured to receive a second pulse of the timer duration signal 510. The logic circuit 420 can be configured to stop outputting a second pulse of the retry signal 422 in response to receiving the second pulse of the timer duration signal 510. As such, at time $t_4$, the second pulse of the retry signal 422 can transition from high to low corresponding to transitioning the second pulse of the RTRS 508 from high to low, as illustrated in the upper portion 502. Resultantly, at time $t_4$, the capacitor 438 can discharge. Between time $t_4$ and time $t_5$, as illustrated in the lower portion 504, the voltage 512 can be substantially zero (e.g., at a voltage level below the lower reference voltage $V_{refl}$).

At an instance of time $t_{4-5}$ between time $t_4$ and time $t_5$, the fault sensor can be configured to provide a third pulse of the FLT signal 506 indicative of the fault. In some examples, the third pulse of the FLT signal 506 can correspond to the reset signal 436. The third pulse of the FLT signal 506 can be provided to the timer period circuit 416. The timer period circuit 416 can be configured to stop outputting the second pulse of the timer duration signal 510 in response to receiving the third pulse of the FLT signal 506. As such, at the instance of time $t_{4-5}$, as illustrated in the upper portion 502, the second pulse of the timer expiration signal 510 can transition from high to low.

Therefore, over the time intervals, the count value of the counter 442 can act as memory and keep track of the number of retries that have occurred for the circuit protection device. The counter 442 can be configured to count the number of count pulse signals 440 generated by the oscillator 426 based on the voltage pulses 512 generated during each pulse of the RTRS 402 over the time intervals. When the count value reaches a given count value representing a given number of retries $N_P$ set for the circuit protection device, the counter 442 can overflow and output the stop retry signal 444. The stop retry signal 444 can indicate that the given number of retries $N_P$ have occurred for the circuit protection device.

FIG. 6 illustrates an example of a logic gate circuit 600. The logic gate circuit 600 can correspond to (e.g., form part of) of the logic circuit 110 in the example of FIG. 1, the logic circuit 220 in the example of FIG. 2, or the logic circuit 420 in the example of FIG. 4. Therefore, reference may be made to the example of FIGS. 1, 2 and 4 in the following description of the example of FIG. 6. The logic gate circuit 600 can include a first input 602 and a second input 604. The first input 602 can be configured to receive a timer duration signal (e.g., the timer duration signal 106, the timer duration signal 216, or the timer duration signal 416). The second input 604 can be configured to receive a retry timer signal (RTRS) (e.g., the RTRS 108, the RTRS 202, or the RTRS 402).

The logic gate circuit 600 can be configured to receive at the second input 602 the RTRS. The logic gate circuit 600 can be configured to generate a retry signal (e.g., the retry signal 116, the retry signal 222, or the retry signal 422) at an output 606 in response to receiving only the RTRS. For example, the retry signal outputted by the logic gate circuit 600 can have a pulse width that approximates the RTRS when only the RTRS is received by the logic gate circuit 600. In some examples, the logic gate circuit 600 can be configured to receive the RTRS and the timer duration signal. The logic gate circuit 600 can receive the timer duration signal while receiving the RTRS. The logic gate circuit 600 can be configured to adjust a pulse width (e.g., a pulse duration) of the retry signal in response to receiving the timer duration signal. The logic gate circuit 600 can cause the retry signal to transition from a first state to a second different state, corresponding to adjusting the pulse width of the retry signal, in response to receiving the timer duration signal. As such, the logic gate circuit 600 can be configured to output a modified RTRS (e.g., a pulse width adjusted RTRS signal) represented by the retry signal 116.

Accordingly, in some examples, the systems described herein allow for storing a number of retries that have occurred for the circuit protection device using an external circuit (e.g., the external capacitor 234 in FIG. 2). In other examples, the systems described herein can store the number of retires that have occurred for the circuit protection device using a counter (e.g., the counter 442 in FIG. 4). Circuit protection devices configured with the systems described herein do not require costly or complicated analog-to-digital converters (ADC) for converting auto retries parameters (e.g., a retry delay and a number of retries). Hence, the systems herein alleviate the limitations posed by ADCs such as limited bit range, granularity, and non-linearity. In addition, the systems described herein can be manufactured at an effective cost, and do not require a large circuit footprint as an overall die area for the systems herein can be relatively small.

As described herein, external circuits (e.g., capacitors) can be coupled to respective nodes (e.g., pins). Use of external circuits allows for the auto retry parameters for the circuit protection device to be adjusted based on impedances of the external circuits coupled to the respective nodes. Moreover, the configurable auto retry systems described herein allow for pushing of circuits (e.g., the external circuits) onto a circuit board of a system rather than inside a die of the circuit protection device. Even further, the configurable auto retry systems described herein can be configured to distinguish from single fault events (e.g., unexpected transient events occurring during device power up) and multiple fault events (e.g., actual fault events such as overload, etc.).

Moreover, the configurable auto retry systems described herein can be employed to provide for advanced level photography where parameters such as International Standard Organization (ISO) settings, shutter speed, automatic clicker time entail precise configuration and tuning. For example, the configurable auto retry system can be used to set parameters of an aperture control circuit of a camera. The configurable auto retry system can be employed to set a number of aperture openings and an amount of time between aperture openings over a time interval. The external capacitor 414 can set a number of aperture openings for the aperture control circuit. The external capacitors 414,438 can set an amount of time between aperture openings over the time interval. Accordingly, the configurable auto retry system of the present disclosure can be used to control a shooting mode (e.g., a burst mode) of the camera (e.g., still cameras).

In some examples, for the given number of retries $N_P$ set for the circuit protection device based on the capacitances of the capacitors 414,438, a given number of pulses of the RTRS 402 can be provided to the configurable auto retry system 400. Because a number of pulses of the timer duration signal 418 can be based on the given number of the pulses of the RTRS 402, the number of pulses of the timer duration signal 418 outputted by the timer can correspond to the number pulses of the RTRS 402. Thus, the given number of retries $N_P$ set for the circuit protection device can be associated with the number of pulses of the RTRS 402. For example, for the given number of retries $N_P$ set for the circuit protection device, the logic circuit 420 can be configured to receive the given number of pulses of the RTRS 402, and the timer period circuit 416 can be configured to output a corresponding number of pulses of the timer duration signal 418. Accordingly, the number of pulses of the timer duration signal 418 outputted by the timer period circuit 416 can be based on the given number of retries $N_P$ set for the circuit protection device.

By way of example, if it is desired that the circuit protection device is restarted four (4) times (e.g., $N_P=4$), the configurable auto retry system 400 can be provided with four (4) pulses of the RTRS 402 (e.g., from the retry oscillator circuit of the circuit protection device). Because the logic circuit 420 can be configured to output a pulse of the retry signal 422 for each pulse of the RTRS 402, four (4) pulses of the retry signal 422 can be outputted. Due the component induced errors from the current sources 410,432, and the external circuits 414,438, the actual number of retries $N_A$ that would be stored by the counter 442 following a given number of pulses of the retry signal 422 can vary between a minimum actual number of retries ($N_{min\_A}$) and a maximum number of retries ($N_{max\_A}$) (see, e.g., Table in FIG. 7). As such, following a given number of pulses of the RTRS 402, the actual number of retries $N_A$ that could be stored by the counter 442 can deviate by a given percentage from the given number of retries $N_P$ set for the circuit protection device between the minimum actual number of retries $N_{min\_A}$ and the maximum number of retries $N_{max\_A}$.

FIG. 7 depicts a table 700 illustrating examples of component induced errors and their effects on an actual number of retries $N_A$ that could be stored by the counter 442 following a given number of pulses of the RTRS 402. The table 700 illustrates that the actual number of retries $N_A$ that could be stored by the counter 442 can be in a retry range defined by a minimum value $N_{min\_A}$ (e.g., a minimum number of actual retries $N_A$ that could be stored at the counter 438 following the given number of pulses of the RTRS 402) and a maximum value $N_{max\_A}$ (e.g., a maximum number of actual retries $N_A$ that could be stored at the counter 442 following the given number of pulses of the RTRS 402). In the example of FIG. 7, it can be assumed that the current sources 410,432 can induce about 11% of error and the external capacitors 414,438 can induce about 22% of error in the count value of the counter 442 following the given number of pulses of the RTRS 402. As such, in the example of FIG. 7, it can be assumed that a total component induced error can be about 33%. As such, for example, when $N_P=4$ for the circuit protection device, the actual number retries $N_A$ that could be stored by the counter 442 can be in the retries range between $N_{min\_A}=3$ and $N_{max\_A}=6$ following four (4) pulses of the RTRS 402. Accordingly, the actual number of retries $N_A$ that could be stored by the counter 442 can deviate by a given percentage (e.g., 33%) from the given number of retries $N_P$ defined for the circuit protection device. The effect that the component induced errors have on the actual number retries $N_A$ for the circuit protection device can be appreciated with the example of FIG. 8.

Figure 8:
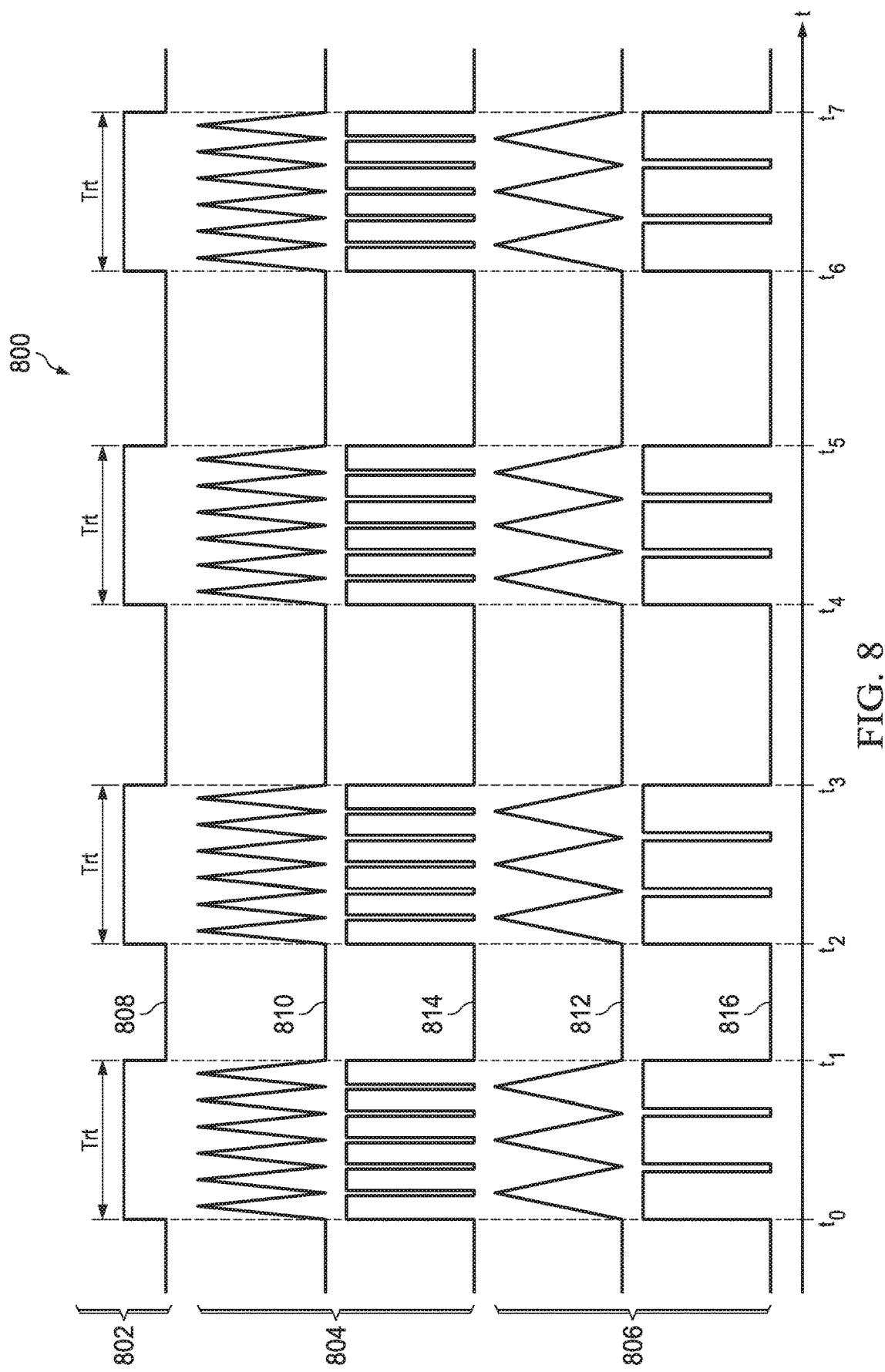
FIG. 8 illustrates yet an even further example of a timing and voltage diagram.

FIG. 8 illustrates an example of a timing and voltage diagram 800. The timing and voltage diagram 800 can be used to represent signals during operation of the configurable auto retry system 100 in the example of FIG. 1, or the configurable auto retry system 400 in the example of FIG. 4. Therefore, reference may be made to the example of FIGS. 1 and 4 in the following description of the example of FIG. 8.

The example timing and voltage diagram 800 can include a retry signal waveform 802, a first set of waveforms 804, and a second set of waveforms 806. The retry signal waveform 802 demonstrates a retry signal 808 (e.g., the retry signal 422) that can be outputted by the logic circuit 420 with respect to time. The second set of waveforms 804 demonstrate a voltage at the second node 434 established by the capacitor 438. For example, with respect to the waveforms 804, the current sources 410,432 and the external capacitors 414,438 are assumed to operate as ideal circuits and do not cause variations in the count value of the counter 442. The second set of waveforms 806 demonstrate a voltage at the second node 434 established by the external capacitor 438 with respect to time. For example, with respect to the third diagram 806, the current sources 410,432 and the external capacitors 414,438 are assumed to operate as non-ideal circuits and may cause component induced errors in the counter 442.

In the example of FIG. 8, it can be assumed that four (4) retries were defined for the circuit protection device (e.g., $N_P=4$) and that a capacitance of the non-ideal capacitor 438 is greater than the capacitance of the ideal capacitor 438, such as due to fabrication tolerances. Deviating from the given number of retries $N_P$ set for the circuit protection device can cause the counter 442 to output the stop retry signal 444 prematurely or at a later time. From the foregoing example of FIG. 8, it should become readily apparent that the counter 442 can overflow to output the stop retry signal 444 after a greater number of pulses of the RTRS 402 and correspondingly a greater number of pulses of the retry signal 808. Resultantly, if left uncorrected, the circuit protection device could continue to power cycle beyond given number of retries $N_P$ set for the circuit protection device until the counter 442 reaches the given count value corresponding to the given number of retries $N_P$.

As a further example, in FIG. 8, at a time $t_0$, the logic circuit 420 can be configured to output a first pulse of the retry signal 808. In the first set of waveforms 804, at time $t_0$, the ideal capacitor 438 can establish voltage pulses 810 at the second node 434. In the second set of waveforms 806, at the time $t_0$, the non-ideal capacitor 438 can establish voltage pulses 812 at the second node 434. Between time $t_0$ and time $t_1$, as illustrated by the first and second set of waveforms 804,806, the ideal and non-ideal capacitors 438, respectively, can be charged and discharged repeatedly during the first pulse of the retry signal 808. Due to component induced errors, such as due to variations in physical properties of the non-ideal capacitor 438 and the current sources 410,432, the non-ideal capacitor 438 can establish a non-ideal number of voltage pulses 812 at the second node 434.

The ideal-capacitor 438 can establish an ideal-number of voltage pulses 810 at the second node 434. The component induced errors from the non-ideal circuits can cause the non-ideal capacitor 438 to establish a lesser amount of voltage pulses 812 at the node 434 in contrast to the ideal capacitor 438, as illustrated in the second set of waveforms. Between time $t_0$ and time $t_1$, as illustrated by the first and second set of waveforms 804, 806, the oscillator 426 (e.g., the switch controller 428) can be configured to output count pulse signals 814,816, respectively, for each voltage pulse 810,812 at the second node 434. The counter 442 can be configured to count each count pulse signal 814,816 and increment the count value. The counter 442 can be configured to increment its count value based on the number of count pulse signals 814,816 outputted by the oscillator 426 over the time intervals (e.g., $t_1$ to $t_2$, $t_2$ to $t_3$, $t_3$ to $t_4$, and so on).

As illustrated by the first set of waveforms 804, the counter 442 can be configured to reach the given count value corresponding to the given number of retries $N_P$ within four (4) pulses of the retry signals 808. Accordingly, when ideal-circuits are employed, the counter 442 can output the stop retry signal 444 according to the given number of retries $N_P$ defined for the circuit protection device. The component induced errors can cause fewer voltage pulses 812 to be generated, as illustrated in the second set of waveforms 806. Thus, after four (4) pulses of the retry signal 808, the counter 442 can require additional retry signal pulses as the count value of the counter 442 has not reached the given count value corresponding to the given number of retries $N_P$ defined for the circuit protection device. Because additional retry signal pulses can be required to overflow the counter 442, the circuit protection device can power cycle a greater number of retries until the counter 442 reaches the given count value. Accordingly, the circuit protection device can power cycle additional times beyond a desired amount (e.g., the given number of retries $N_P$).

FIG. 9 illustrates an example of a retry error masking circuit 900. The circuit 900 can be associated (e.g., used with) with the configurable auto retry system 100 in the example of FIG. 1, or the configurable auto retry system 400 in the example of FIG. 4. Therefore, reference may be made to the example of FIGS. 1 and 4 in the following description of the example of FIG. 9.

The retry error masking circuit 900 can be configured to compensate for component induced errors such that the circuit protection device retries (e.g., power cycles) according to a given number of retries ($N_P$) set for the circuit protection device. The retry error masking circuit 900 can include a counter 902. In some examples, the counter 902 can correspond to a decimal counter. The counter 902 can be configured to monitor for pulses of the timer duration signal 418 being outputted by the timer period circuit 416 over time intervals. The counter 902 can be configured to monitor for an edge (e.g., rising or falling edge) of each pulse of the timer duration signal 418. In response to detecting each edge of each pulse of the timer duration signal 418, the counter 902 can be incremented. The counter 902 can be configured to output a timer duration count signal 904 characterizing a number of pulses of the timer duration signal 418 counted over the timer intervals. Because the number of pulse of the timer duration signal 418 can be based on a number of the pulses of the RTRS 402, the number of pulses of the timer duration signal 418 outputted by the timer period circuit 416 can correspond to the number pulses of the RTRS 402. In some examples, the timer duration count signal 904 can include binary information corresponding to a decimal digit. In such examples, the number of pulses of the timer duration signal 416 counted can correspond to a given decimal digit.

The retry error masking circuit 900 can include a decoder 906. The decoder 906 can be coupled to the counter 902. In some examples, the decoder 906 can correspond to a binary decoder. The decoder 906 can be configured to decode the timer duration count signal 904 and output a decoded retry signal 908. The decoded retry signal 908 can indicate that the given number of retries $N_P$ set for the circuit protection device has occurred. The decoder 906 can be configured to decode the timer duration count signal 904 according to a decoding table. FIG. 10 illustrates an example of a decoding table 1000. The decoding table 1000 can characterize a behavior of the decoder 906 in the example of FIG. 9. For a given decimal digit, the decoder 906 can be configured to output the decoded retry signal 908, represented as a "1" in the decoding table 1000. For all other decimal digits, represented as "OTHER" in the decoding table 1000, the decoder 906 can be configured to not output the decoded retry signal 908, represented as a "0" in the decoding table 1000.

The decoder 906 can be configured to output the decoded retry signal 908 when the number of pulses of the timer duration signal 416 counted over the timer intervals is equal to the given number of retries $N_P$ that have been set for the circuit protection device, as defined by the decoding table 1000. For example, when four (4) retries have been set for the circuit protection device (e.g., $N_P$=4), the counter 902 can be configured to monitor for four (4) pulses of the timer duration signal 416 over the time intervals and output a corresponding timer duration count signal 904. The decoder 906 can be configured to output the decoded retry signal 908 based on the corresponding timer duration count signal 904.

The retry error masking circuit 900 can include a logic circuit 910. The logic circuit 910 can be coupled to the decoder 906 and to a logic counter circuit 912. In some examples, the logic counter circuit 912 can form part of the counter 442 in the example of FIG. 4. In some examples, the logic circuit 910 can correspond to an AND gate circuit. The logic circuit 910 can be configured to receive the decoded retry signal 908 and a counter count signal 914 provided by the logic counter circuit 912. The counter count signal 914 can be outputted by the counter 912 following the given number of pulses of the RTRS 402 and can represent a shifted number of retries ($N_S$) of the actual number of retries $N_A$ that have occurred for the circuit protection device. Thus, for example, when the given number of retries set for the circuit protection is four (4) (e.g., $N_P$=4), the actual number of retries $N_A$ stored at the counter 442 can be about six (6) following the given number pulses of the RTRS 402. The logic counter circuit 912 can be configured to output the counter count signal 914 to represent a shift of the actual number of retries $N_A$ stored at the counter 442. As such, the counter count signal 914 can represent the shifted number of retries $N_S$, which in the current example, can be four (4), which is the given number of the retries $N_P$ set for the circuit protection device. The logic circuit 910 can be configured to output a stop retry signal 916 based on the decoded retry signal 908 and the counter count signal 914. The stop retry signal 916 can indicate that the given number of retries $N_P$ set for the circuit protection device have occurred.

Because the number of pulses of the timer duration signal 418 outputted by the timer period circuit 416 can be based on the given number of retries $N_P$ set for the circuit protection device, the decoder 906 can be configured to output decoded retry signal 908 over a given time interval. Additionally, because the logic counter circuit 912 is configured to output the counter count signal 914 following the given number pulses of the RTRS 402, the logic circuit 919 can be configured to output the stop retry signal 916 over the given time interval. Timing the logic circuit 910 to receive the decoded retry signal 908 and the counter count signal 914 over the given time interval, the logic circuit 910 can be configured to output the stop retry signal 916 such that the actual number of retries that have occurred for the circuit protection device matches the given number of retries $N_P$ set for the circuit protection device. Accordingly, the stop retry signal 916 can indicate that the given number of retries $N_P$ set for the circuit protection device have occurred.

As described herein, the actual number retries $N_A$ that could be stored by the counter 442 can vary between a minimum value $N_{min\_A}$ and a maximum value $N_{max\_A}$ following the given number of pulses of the RTRS 402 due to the component induced errors. To compensate for the component induced errors, which can cause the actual number of retries $N_A$ that could be stored by the counter 442 to vary between respective minimum and maximum values, the counter count signal 914 can be delayed in time relative to the decoded retry signal 908 such that the stop retry signal 916 is outputted when the given number of retries $N_P$ set for the circuit protection device have occurred. By tapping intermediate output nodes (e.g., Q nodes) of flip-flop circuits of the counter 438, the logic counter circuit 912 can be configured to output the counter count signal 914 before to the decoded retry signal 908 can be outputted by the decoder 906. Outputting the counter count signal 914 before the decoded retry signal 908 can be outputted by the decoder 906 can be representative of shifting the actual number of retries $N_A$ stored by the counter 442. Accordingly, the component induces errors can be masked (e.g., compensated) by the retry error masking circuit 900 such that the circuit protection device can power cycled according to the given number of retries $N_P$ set for the circuit protection device.

FIG. 11 illustrates an example of shifting of an actual number of retries $N_A$ stored by a counter. The diagram 1100 can be associated with operation of the configurable auto retry system 100 in the example of FIG. 1, or the configurable auto retry system 400 in the example of FIG. 4, and further with operation of the retry error masking circuit 900 in the example of FIG. 9. For ease of explanation, the diagram 1100 will be described with respect to FIG. 9.

The diagram 1100 can include a left portion 1102 and a right portion 1104. The left portion 1102 is a pictorial example of outputs of the decoder 906 over one or more time intervals. As explained herein, for a given decimal digit (e.g., 4) provided by the counter 902, the decoder 906 can be configured to output a decoded retry signal 908 demonstrated as "1" in the example of FIG. 11. For all other decimal digits, the decoder 906 can be configured to provide the decoded retry signal as a "0" (e.g., no decoded retry signal 908 is provided by the decoder 906) in the example of FIG. 11. For example, when four (4) retries are set for the circuit protection device (e.g., $N_P$=4), the decoder 906 can be configured to output the decoded retry signal 908 following four (4) pulses of the timer duration signal 416 (illustrated as "N_decd=4" in the example of FIG. 11), as shown in the left portion 1102.

The right portion 1104 pictorially depicts shifting 1106 of the actual number of retries $N_A$ stored at the counter 442 such that the counter count signal 914 is outputted by the logic counter circuit 912 prior to the decoder 906 outputting the decoded retry signal 908 during a given time interval. The logic circuit 910 can be configured to output the stop retry signal 916 in response to receiving both the decoded retry signal 908 and the counter count signal 914 during the given time interval. For example, assuming that four (4) retries are set for the circuit protection device (e.g., $N_P$=4), the actual number of retries $N_A$ that could be stored by the counter 442 can be in a retry range defined by $N_{min\_A}$ and $N_{max\_A}$, as depicted in the right portion 1104, following a given number of pulses of the RTRS 402. The outputting of the counter count signal 914 by the logic counter circuit 912 prior to the decoder 906 outputting the decoded retry signal 908 during the given time interval can represent the shifting 1106 of the actual retry range, as depicted in the right portion 1104.

The shifting 1106 of the actual retry range such that the $N_{min\_A}$ is at a new minimum value ($N_{min\_A\_S}$) and $N_{max\_A}$ is at a new maximum value ($N_{min\_A\_S}$) can represent the outputting of the counter count signal 914 prior to the outputting of the decoded retry signal 908. The new maximum value $N_{min\_A\_S}$ can correspond the given number of retries $N_P$ set for the circuit protection device, and the counter count signal 914 can represent the shifted number of retries $N_S$ corresponding to the new maximum value $N_{min\_A\_S}$. By outputting the counter count signal 914 prior to the outputting of the decoded retry signal 908 during the given time interval can compensate for positive or negative side variation. Accordingly, the component induces errors can be masked (e.g., compensated) by the retry error masking circuit 900 such that the circuit protection device can power cycled according to the given number of retries $N_P$ set for the circuit protection device.

Figure 12:
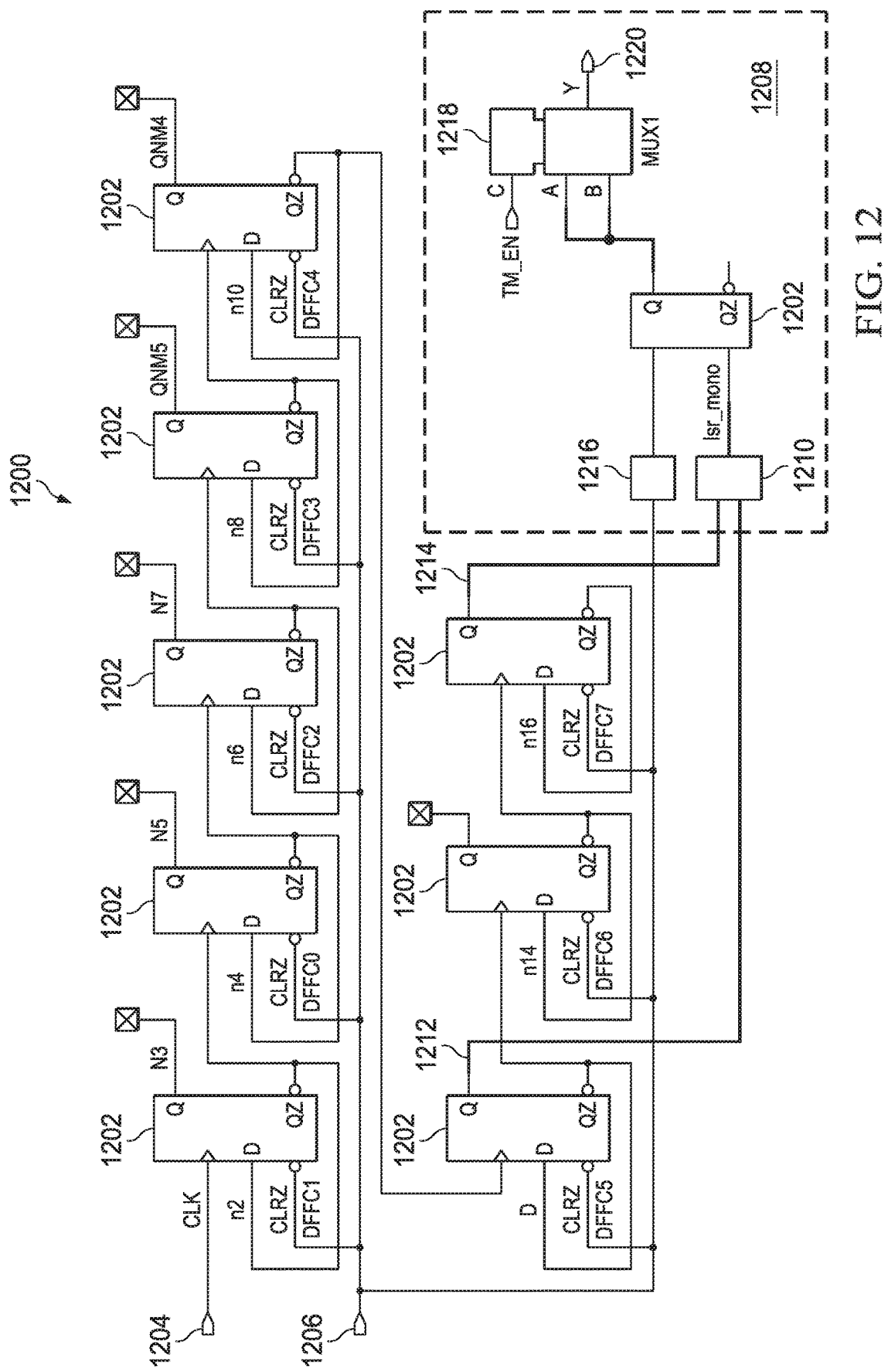
FIG. 12 illustrates an example of a schematic of a counter.

FIG. 12 illustrates an example of a schematic of a counter 1200. In some examples, the counter 1200 can correspond to the counter 442 of the example in FIG. 4. The counter 1200 thus can be used to count retries during operation of the configurable auto retry system 400 in the example of FIG. 4.

The counter 1200 can include an arrangement of flip-flop circuits (e.g., DQ flip-flops) 1202 connected in series. The flip-flop circuits 1202 are be configured as an asynchronous digital counter. For example, the flip-flop circuits 1202 latch a digital input value (e.g., 0 or 1) according to a clock signal 1204 at a clock input of the counter 1200, and store a count value at a set of some or all of the Q outputs thereof over a number of clock signals. In some examples, the clock signal 1204 can be based on the count pulse signal 436 outputted by the oscillator 426 (e.g., the switch controller 428) for each voltage pulse established at the second node 430. The example counter 1200 of FIG. 12 demonstrates an eight-bit counter. Different numbers of bits may be used in other examples. A first of the flip-flop circuits 1202 can be triggered based on an edge of the clock signal 1204. The inverted Q output of each flip-flop circuit 1202 is coupled to the clock input of the next adjacent flip-flop circuit in the sequence. The inverted Q output of each flip-flop circuit 1202 is also fed back to its respective D input. Each of the flip-flop circuits 1202 can be configured to receive an input signal 1206. In some examples, the input signal can correspond to a clear signal.

The counter 1200 can be configured to store a count value represented by output signals (e.g., 0 or 1) at the set of some or all of the Q outputs. The count value of the counter 1200 can represent an actual number of retries $N_A$ that have occurred for the circuit protection device for a given number of pulses of the RTRS 402. The actual number of retries $N_A$ stored by the counter 1200 represented by the count value can include component induced errors. Thus, the actual number of retries $N_A$ that could be stored by the counter 1200 can vary between a minimum value $N_{min\_A}$ and a maximum value $N_{max\_A}$ for the given number of pulses of the RTRS 402.

In some examples, the counter 1200 can be include a counter logic circuit 1208. The counter logic circuit 1208 can correspond to the counter logic circuit 912 in the example of FIG. 9. The counter logic circuit 1208 can include a given flip-flop circuit of the flip-flop circuits 1202, as illustrated in FIG. 12. The counter logic circuit 1208 can include a logic circuit 1210. In some examples, the logic circuit 1210 can be an AND gate circuit. The logic circuit 1210 can include inputs coupled to Q outputs 1212 and 1214 of a set of flip-flop circuits of the flip-flop circuits 1202. The logic circuit 1212 can be configured to perform a logical conjunction (e.g., AND) of the values (e.g., output signals) at outputs 1212 and 1214, respectively, to provide a conjugated output signal.

The counter 1200 can include an inverter circuit 1216. In some examples, the inverter circuit 1216 can correspond to a logic NOT gate circuit (e.g., inverter). The inverter circuit 1216 can be configured to receive the input signal 1206. The inverter circuit 1216 can be configured to invert the input signal 1206 to provide an inverted input signal. The given flip-flop circuit can be configured to receive the inverted clear signal and the conjugated output signal and output a value (e.g., a signal) at a Q output of the given flip-flop circuit.

The counter logic circuit 1208 can include a multiplexer 1218. The multiplexer 1218 can include two inputs and an enable input. The multiplexer 1218 can be enabled in response to receiving an enable signal (e.g., from a controller of the restart protection device) at the enable input. The multiplexer 1218 can be configured to provide at an output a counter count signal 1220 based on the value at the Q output of the given flip-flop circuit. The value at the Q output can be provided to the two inputs of the multiplexor 1218 to provide the counter count signal 1220. The counter count signal 1220 can correspond to the counter count signal 914 in the example of FIG. 9.

The counter count signal 1220 can represent a shifted number of retries $N_S$ of the actual number of retries $N_A$ that have occurred for the circuit protection device following the given number of pulses of the retry signal 422. Thus, for example, when the actual number of retries $N_A$ stored by the counter 1200 is six (6), the shifted number of retries $N_S$ being represented by the counter count signal 1220 can be about four (4). The shifted number of retries $N_S$ can correspond to a number of retries substantially near the given number of retries $N_P$.

By utilizing intermediate nodes (e.g., the outputs 1212, 1214), the counter count signal 1220 can be outputted by the counter logic circuit 1208 prior to the decoder 906 outputting decoded retry signal 908 during an interval of time. The outputting of the counter count signal 1220 during the interval of time during which the decoder is outputting the decoded retry signal 918 can be representative of the shifting 1106 of the retry range, as illustrated in FIG. 11. The logic circuit 910 can receive the counter count signal 1224 (e.g., counter count signal 914) prior to receiving the decoded retry signal 908 the given time interval. The logic circuit 910 can be configured to output the stop retry signal 916 in response to signals 1220 and 908. For example, in response to detecting a rising edge of the counter count signal 1220 and a rising edge of the decoded retry signal 908, the logic circuit 910 can be configured to output the stop retry signal 916. The stop retry signal 916 can indicate that the given number of retries $N_P$ set for the circuit protection device have occurred.

Figure 13:
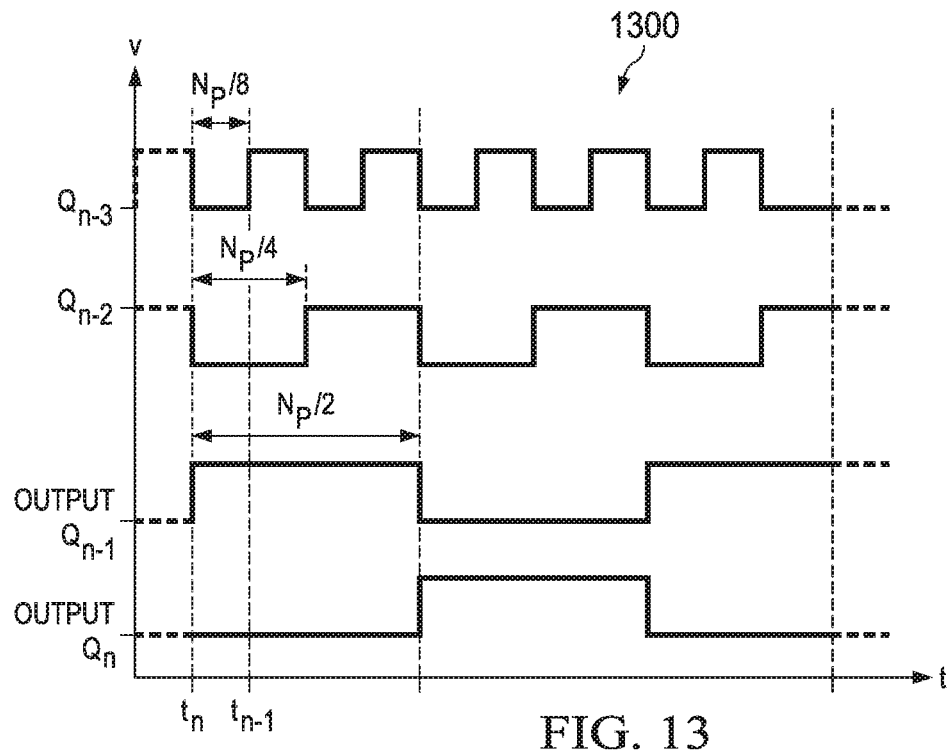
FIG. 13 illustrates an even further example of a timing diagram.

FIG. 13 illustrates an example of a timing diagram 1300 for operation of the counter 1200 in the example of FIG. 12. Therefore, reference is to be made to the example of FIG. 12 in the following description of the example in FIG. 13.

The timing diagram 1300 illustrates output signals $Q_{n-3}$, $Q_{n-2}$, $Q_{n-1}$, $Q_n$ with respect to time over a given time interval for select flip-flops circuits of the counter 1200. The output signal ($Q_{n-3}$) can be associated with the operation of the flip-flop circuit 1202 with its output 1214 coupled to a first input of the logic circuit 1210, the output signal ($Q_{n-2}$) can be associated with the operation of the flip-flop circuit 1202 between the flip-flop circuits with respective outputs 1212,1214 coupled to inputs of the logic circuit 1210, and the output signal ($Q_{n-1}$) can be associated with the operation of the flip-flop circuit with its output 1214 coupled to a second input of the logic circuit 1210. The output signal ($Q_n$) can be associated with the operation of the given flip flop circuit, and the output signal ($Q_n$) can be provided at an inverting output of the given flip-flop circuit that is not coupled to the inputs of the multiplexer 1222.

A pulse width of each output signal $Q_{n-3}$, $Q_{n-2}$, $Q_{n-1}$, $Q_n$ can have a pulse width that can be a fraction of the given number of retries $N_P$ set for the circuit protection device. For example, a pulse width of the output signal $Q_{n-3}$ (e.g., at the output 1212) can be a fraction of the given number of retries (e.g., $N_P/8$) set for the circuit protection device. A pulse width of the output signal $Q_{n-2}$ can be a fraction of the given number of retries (e.g., $N_P/4$) set for the circuit protection device. Furthermore, a pulse width of the output signal $Q_{n-1}$ (e.g., at the output 1214) can be a fraction of the given number of retries (e.g., $N_P/2$).

At a time $t_n$, the logic circuit 1210 can be configured to detect a rising edge of the output signal $Q_{n-3}$ at the output 1212 provided by the flip-flop circuit 1202. Further, at a time $t_n$, the first logic circuit 1210 can be configured to detect a rising edge of the output signal $Q_{n-1}$ provided by the flip-flop circuit at its output 1212. Because the pulse width of the output signal $Q_{n-3}$ can be a fraction of the given number of retries (e.g., $N_P/8$) defined for the circuit protection device, and the pulse width of the output signal $Q_{n-1}$ can be a fraction of the given number of retries (e.g., $N_P/2$) defined for the circuit protection device, between the time $t_n$ and a time $t_{n+1}$ the offset circuit 1208 can be configured to output the conjugated output signal for a period of time between time $t_n$ and the time $t_{n+1}$. Given the relationship of the pulse width of the output signals $Q_{n-3}$ and $Q_{n-1}$ being a fraction of the given number of retries $N_P$ defined for the circuit protection device, the conjugated output signal can have a pulse width that can be a fraction of the given number of retries (e.g., $(5\!/\!8)N_P$). Resultantly, a pulse width of the conjugated output signal can be a given percentage (e.g., 0.0625%) of the given number of retries $N_P$. The counter count signal 1220 can be outputted by the logic counter circuit 1210 based on the conjugated output signal and an inverse clear signal following the given number of pulses of the RTRS 402.

By monitoring for the rising edges of the output signals $Q_{n-3}$ and $Q_{n-1}$ at the time $t_n$ (e.g., at some instance of time when both output signals can transition from a "LOW" to "HIGH"), the logic counter circuit 1210 can output the counter count signal 1220 before the decoded retry signal 908 can be outputted by the decoder 906, and can be representative of shifting the actual number of retries $N_A$ stored by the counter 438.

The outputting of the counter count signal 1220 by the logic counter 1200 before the outputting of the decoded retry signal 908 by the decoder 906 can represent offsetting (e.g., by the given percentage) the maximum value $N_{max\_A}$ of the actual number of retries $N_A$ that could be stored by the counter 1200 for the given number of retries $N_P$ set for the circuit protection device. The new shifted maximum value $N_{max\_A\_S}$ of the actual number of retries $N_A$ can be represented by the counter count signal 1220, and can be outputted by the logic counter circuit 912 before the decoder 906 outputs the decoded retry signal 908. Accordingly, positive side variation of the actual counted number of retries $N_A$ that could be stored by the counter 438 (e.g., between $N_P$ and $N_{max\_A}$) can be accommodated by outputting the counter count signal 1220 before the outputting of the decoded retry signal 908. The logic circuit 910 can be configured to output the stop retry signal 916 based on the decoded retry signal 908 and the counter count signal 1220. The stop retry signal 916 can indicate that the given number of retries $N_P$ set for the circuit protection device have occurred.

Figure 14:
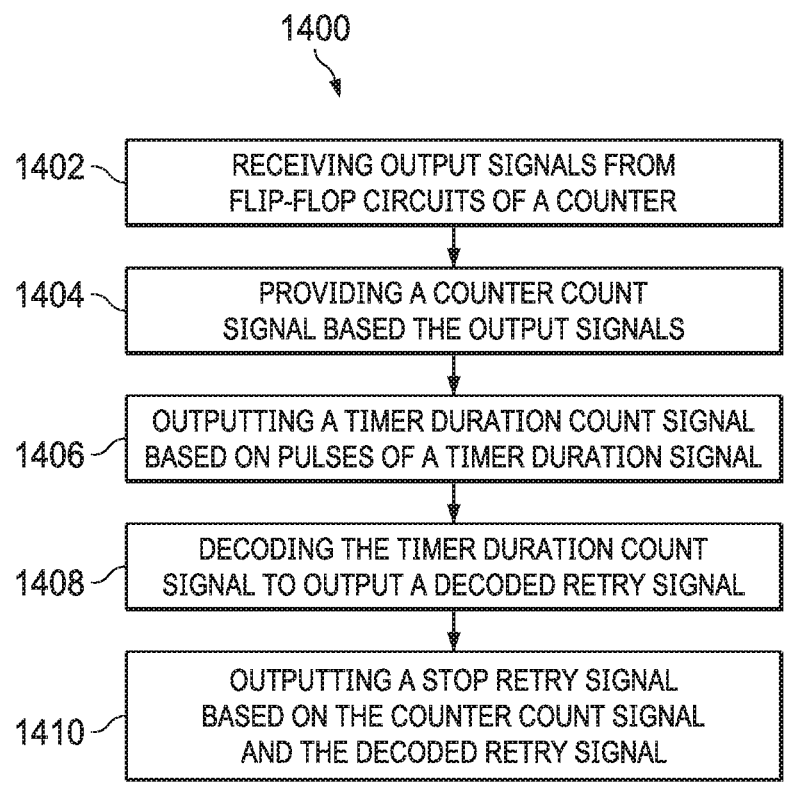
FIG. 14 illustrates an example of a method for masking auto retry count errors in a configurable auto retry system.

In view of the foregoing structural and functional features described above, example methods will be better appreciated with references to FIG. 14. While, for purposes of simplicity of explanation, the example method of FIG. 14 is shown and described as executing serially, it is to be understood and appreciated that the example method is not limited by the illustrated order, as some actions could in other examples occur in different orders, multiple times and/or concurrently from that shown and described herein.

FIG. 14 illustrates an example of a method 1400 for masking auto retry count errors in a configurable auto retry system. The configurable auto retry system can correspond to the configurable auto retry system 400 in the example of FIG. 4. The method 1400 can be implemented by the retry error masking circuit 900 in the example of FIG. 9. The method 1400 can begin at 1402 by receiving output signals from flip-flop circuits of a counter (e.g., the counter 442, or the counter 1200) established based on a voltage at a node (e.g., the node 434) of an auto retry system in response to a retry timer signal (RTRS) (e.g., the RTRS 402) over time intervals. At 1404, providing a counter count signal (e.g., the counter count signal 914) based on the output signals. The counter count signal can indicate a shifted number of retries of an actual number of retries stored at the counter that have occurred over the time intervals.

At 1406, outputting a timer duration count signal (e.g., the timer duration count signal 904) characterizing a number of pulses of a timer duration signal (e.g., the timer duration signal 416) outputted by the auto retry system over the time intervals. The number of pulses of the timer duration signal outputted by the auto retry system can be based on a number of the RTRS over the time intervals. At 1408, decoding the timer duration count signal according to a decoding table to output a decoded retry signal (e.g., the decoded retry signal 908). At 1410, outputting a stop retry signal (e.g., the stop retry signal 916) based on the counter count signal and the decoded retry signal. The stop retry signal can indicate that a given number of retries have occurred.

In this description and the claims, the term "based on" means based at least in part on.

Modifications are possible in the described embodiments, and other embodiments are possible, within the scope of the claims.

What is claimed is:

1. A system comprising:
    a timer duration circuit coupled to a first node and configured to output a timer duration signal, wherein a first circuit is coupled to the first node, and the timer duration signal defines a time duration for a retry signal based on an impedance of the first circuit;
    a logic circuit configured to control the retry signal that is output to at least one integrator circuit to control a current to a second node based on one of the timer duration signal, a retry timer signal (RTRS), and a combination thereof, wherein a second circuit is coupled to the second node and to provide a voltage at the second node based on an impedance of the second circuit and the current; and
    an output circuit configured to output a stop retry signal based on the voltage at the second node, wherein the stop retry signal is to indicate a number of retries that have occurred, the number of retries being set based on the impedances of the first and second circuits.

2. The system of claim 1, wherein the first circuit is to provide a voltage at the first node based on the impedance of the first circuit and a current from a current source.

3. The system of claim 2, wherein the timer duration circuit comprises:
    an oscillator configured to output a retry timer delay signal based on the voltage at the first node; and
    a timer period circuit configured to output the timer duration signal based on the retry timer delay signal and a multiplication factor.

4. The system of claim 2, wherein the logic circuit is configured to output the retry signal during a given time interval in response receiving the RTRS, the retry signal being used to control the at least one integrator circuit to provide the current at the second node to establish the voltage at the second node.

5. The system of claim 4, wherein during the given time interval subsequent to the retry signal being output, the logic circuit is configured to receive the RTRS and the timer duration signal and cause the retry signal to transition from a first state to a second different state.

6. The system of claim 5, wherein the second circuit is configured to store a charge based on the current at the second node during an active portion of the retry signal, wherein an amount of charge stored at the second circuit is representative of the number of retries that have occurred, the voltage at the second node being established based on the charged stored at the second circuit.

7. The system of claim 6, wherein the second circuit is charged during active portions of retry signals over time intervals.

8. The system of claim 7, wherein the output circuit comprises a comparator, the comparator being configured to compare the voltage at the second node to a reference voltage, the comparator being configured to output the stop retry signal in response to the voltage at the second node being equal to or greater than the reference voltage.

9. The system of claim 5, wherein the at least one integrator circuit is configured to charge and discharge the second circuit repeatedly during an active portion of the retry signal based on the current provided by the at least one integrator circuit, wherein voltage pulses are established at the second node in response to charging and discharging the second circuit during the active portion of the retry signal.

10. The system of claim 9, wherein the output circuit comprises a counter that is configured to store a count value based on the voltage pulses during each active portion of the retry signal, wherein the count value is representative of the number of retries that have occurred and the counter is configured to output the stop retry signal based the count value.

11. The system of claim 10, further comprising a counter reset circuit configured to output a counter reset signal based on an amount of time between pulses of the timer duration signal being outputted by the timer duration circuit, wherein the counter is configured to clear the count value in response to the counter reset signal.

12. The system of claim 11, wherein the first circuit comprises one or more capacitors and the second circuit comprises one or more capacitors.

13. A system comprising:
a first circuit configured to receive output signals from flip-flop circuits of a counter established based on a voltage at a node of an auto retry system in response to a retry timer signal (RTRS) over time intervals, wherein the first circuit is configured to provide a counter count signal based on the output signals, wherein the counter count signal is to indicate a shifted number of retries of an actual number of retries stored at the counter that have occurred over the time intervals; and
a second circuit configured to output a stop retry signal based on the counter count signal and a decoded retry signal outputted following a given number of pulses of the RTRS over the time intervals, wherein the stop retry signal indicates that a given number of retries have occurred.

14. The system of claim 13, wherein the first circuit comprises:
an AND gate circuit configured to implement a logical negation on the output signals from the flip-flop circuits to provide a conjugated output signal;
an inverter circuit configured to implement a logical negation on an input signal provided to the counter to provide an inverted input signal; and
an output circuit configured to output the counter count signal based on the conjugated output signal and the negated clear signal.

15. The system of claim 14, wherein the output circuit comprises:
a given flip-flop circuit of the counter different from the flip-flop circuits providing the output signals, the given flip-flop circuit being configured to output a given signal based on the conjugated output signal and the negated clear signal; and
a multiplexor configured to provide the counter count signal based on the given signal.

16. The system of claim 14, wherein a pulse width of the conjugated output signal is based on respective pulse widths of the output signals provided by the flip-flop circuits, wherein the respective pulse widths of the output signals is a fraction of the given number of retries.

17. The system of claim 14, wherein the counter is a first counter, and wherein the second circuit comprises:
a second counter configured to output a timer duration count signal characterizing a number of pulses of a timer duration signal outputted by the auto retry system over the time intervals, wherein the number of pulses of the timer duration signal outputted by the auto retry system is based on a number of the RTRS over the time interval;
a decoder configured to decode the timer duration count signal according to a decoding table to output the decoded retry signal; and
a logic circuit configured to output the stop retry signal based on the counter count signal and a decoded retry signal.

18. A circuit comprising:
a first circuit having a first input coupled to an output of a first flip-flop circuit and a second input coupled to an output of a second flip-flop circuit;
a logic circuit having first and second inputs, the first input of the logic circuit coupled to an output of the first circuit;
a decoder having an output coupled to the second input of the logic circuit; and
a counter having an input coupled to an auto retry system and an output coupled to an input of the decoder.

19. The circuit of claim 18, wherein:
the counter is configured to count a number of pulses of a timer duration signal outputted by a timer duration circuit of the auto retry system following a given number of retry timer signals (RTRS) over time intervals,
the decoder is configured to output a decoded timer delay signal based on the number of pulses of the timer duration signal outputted by the timer duration circuit,
the first circuit is configured to receive a first output signal from the first flip-flop circuit and a second output signal from the second flip-flop circuit established based on a voltage at a node of the auto retry system in response to RTRS over the time intervals, and further configured to output a counter count signal based on the first and second output signals, the logic circuit is configured to output a stop retry signal based on the decoded timer delay signal and the counter count signal.

20. The circuit of claim 19, wherein the first circuit is configured to:
  implement a logical negation on the first and second output signals from the respective first and second flip-flop circuits to provide a conjugated output signal;
  implement a logical negation on a clear signal provided to the counter to output a negated clear signal; and
  output the counter count signal based on the conjugated output signal and the negated clear signal.

* * * * *